United States Patent
Oh et al.

(10) Patent No.: US 7,396,726 B2
(45) Date of Patent: Jul. 8, 2008

(54) METHODS OF FABRICATING SURROUNDED-CHANNEL TRANSISTORS WITH DIRECTIONALLY ETCHED GATE OR INSULATOR FORMATION REGIONS

(75) Inventors: Chang-Woo Oh, Gyeonggi-do (KR); Dong-Gun Park, Gyeonggi-do (KR); Dong-Won Kim, Gyeonggi-do (KR); Sung-Young Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 383 days.

(21) Appl. No.: 11/095,969

(22) Filed: Mar. 31, 2005

(65) Prior Publication Data

US 2005/0224889 A1    Oct. 13, 2005

(30) Foreign Application Priority Data

Apr. 9, 2004   (KR) ...................... 10-2004-0024595

(51) Int. Cl.
*H01L 21/336* (2006.01)
(52) U.S. Cl. ................. 438/280; 438/924; 257/E21.442
(58) Field of Classification Search ................. 438/280, 438/924; 257/E21.444
See application file for complete search history.

(56) References Cited

U.S. PATENT DOCUMENTS

| | | | |
|---|---|---|---|
| 6,396,108 B1 | 5/2002 | Krivokapic et al. | |
| 6,605,847 B2 * | 8/2003 | Kim et al. ................... | 257/401 |
| 7,144,820 B2 * | 12/2006 | Sung .......................... | 438/719 |

FOREIGN PATENT DOCUMENTS

| | | |
|---|---|---|
| JP | 2002-151688 | 5/2002 |
| JP | 2002-270850 | 9/2002 |

* cited by examiner

*Primary Examiner*—Howard Weiss
(74) *Attorney, Agent, or Firm*—Myers Bigel Sibley & Sajovec

(57) ABSTRACT

An elongate stacked semiconductor structure is formed on a substrate. The stacked semiconductor structure includes a second semiconductor material region disposed on a first semiconductor material region. The first semiconductor material region is selectively doped to produce spaced-apart impurity-doped first semiconductor material regions and a lower dopant concentration first semiconductor material region therebetween. Etching exposes a portion of the second semiconductor material region between the impurity-doped first semiconductor material regions. The etching removes at least a portion of the lower dopant concentration first semiconductor material region to form a hollow between the substrate and the portion of the second semiconductor material region between the impurity-doped first semiconductor material regions. An insulation layer that surrounds the exposed portion of the second semiconductor material region between the impurity-doped first semiconductor material regions is formed. The hollow may be filled with a gate electrode that completely surrounds the exposed portion of the second semiconductor material region, or the gate electrode may partially surround the exposed portion of the second semiconductor material region and an insulation region may be formed in the hollow.

18 Claims, 48 Drawing Sheets

METHODS OF FABRICATING SURROUNDED-CHANNEL TRANSISTORS WITH DIRECTIONALLY ETCHED GATE OR INSULATOR FORMATION REGIONS

RELATED APPLICATION

This application claims priority from Korean Patent Application No. 10-2004-24595, filed on Apr. 9, 2004, the content of which is herein incorporated by reference in its entirety.

BACKGROUND OF THE INVENTION

This invention generally relates to semiconductor devices and methods of fabricating the same and, more specifically, to transistors with surrounded channel regions and methods of fabrication therefor.

As the size of transistors has decreased, short channel effects may extend relatively deep into the devices. In particular, as junction depths have become shallow, leakage current and source/drain resistance have generally increased. In addition, the performance of transistors is closely related with drive currents and the drive current of transistors has generally decreased with reduced channel width.

To address these problems, transistors with various structures have been introduced. In a partially insulated field effect transistor (PiFET), an insulating layer is formed under a channel and has a structure capable of preventing a punch-through phenomenon between source and drain. However, this structure is generally not suitable for a high-performance transistor because the reduction of a drain current due to the reduction of the channel width still remains a problem.

In a conventional gate all around type transistor, a gate surrounds a channel. In such a transistor, a gate electrode is formed in two sides or three sides of a fin-shaped channel, thus increasing the channel length without unduly increasing the planar area of the transistor. A fin field effect transistor (FinFET) having an active region with a fin-shaped extending vertically can reduce the width of a fin needed to form a fully depleted channel. As a result, short channel effect can be reduced. Techniques for fabricating gate all around type transistors are disclosed in Korean Patent Application No. 2001-0019525 entitled "A SEMICONDUCTOR DEVICE HAVING GATE ALL AROUND TYPE TRANSISTOR AND METHOD OF FABRICATING THE SAME" and U.S. Pat. No. 6,605,847 entitled "SEMICONDUCTOR DEVICE HAVING GATE ALL AROUND TYPE TRANSISTOR AND METHOD OF FORMING THE SAME".

FIGS. 1A to 4A are plan views illustrating a fabricating method of a conventional gate all around type transistor, FIGS. 1B to 4B and 1C to 4C are cross-sectional views of the structures illustrated in FIGS. 1A to 4A in X and Y directions, respectively. Referring to FIGS. 1A, 1B, and 1C, an active layer pattern is formed on a lower substrate 10 and a buried oxide layer 12. The active layer pattern includes a stacked structure including a silicon-germanium layer 14 and a silicon layer 16. A surface of the active layer pattern is oxidized to form an insulating layer 18. Referring to FIGS. 2A, 2B, and 2C, after forming an etch barrier layer on the substrate, the etch barrier layer in a gate region is removed to form an etch barrier pattern 20. A portion of the insulating layer 18 covering the gate region is removed to expose the silicon-germanium layer 14 and the silicon layer 16. The silicon-germanium layer 14 is selectively removed to form a hollow 24 using an isotropic etch process. Because an isotropic etch process is performed to form the hollow 24, the gate region preferable is narrow in exposed width. In order to secure a desired channel length, it is typically required to expose a narrower width than the desired channel length.

Referring to FIGS. 3A, 3B, and 3C, a gate insulating layer 26 is formed on a surface of an exposed silicon layer 16. A conductive layer 28 that fills in the gate region and the hollow is formed. Referring to FIGS. 4A, 4B, and 4C, the conductive layer 28 is removed using an anisotropic etch process or a chemical mechanical polishing (CMP) method to expose the etch barrier pattern 20. The exposed etch barrier layer 20 is removed to expose an active pattern. As shown in FIGS. 4A, 4B, and 4C, a gate electrode 30 is formed on the active pattern. The gate electrode extends along sidewalls of the active pattern and fills in the hollow 24. Accordingly, a channel may be formed at three sides of the active pattern as well as the hollow. Source/drains may be formed at an active region at both sides of the gate electrode.

As shown, a channel length in the hollow is different from that in three sides of the active pattern. As previously mentioned, while selectively etching silicon-germanium, an isotropic etch process is performed in source/drain directions. If the active pattern is thick in the hollow in order to increase a channel width, under-cut will be more pronounced in the source/drain directions. As a result, as the channel width is increased, a width difference of a gate electrode between the hollow and an upper portion of the active pattern is increased.

It is believed that these problems are not recognized in the conventional art. In the event that source/drain are aligned and formed at the gate electrode over the active region, an overlap capacitance between the gate electrode formed at the hollow and source/drain may be increased. As a result, speed of transistors may be limited. In addition, because a part of a gate insulating layer is overlapped with source/drain, reliability may be reduced.

SUMMARY OF THE INVENTION

In some embodiments of the present invention, a transistor includes spaced-apart impurity-doped first semiconductor material regions, e.g., impurity-doped silicon-germanium regions, disposed on a substrate. A second semiconductor material region, e.g., a silicon region, is disposed on and extends between the spaced-apart impurity-doped first semiconductor material regions. A gate insulating layer conforms to at least a top surface and sidewalls of a portion of the second semiconductor material region disposed between the impurity-doped first semiconductor material regions. A gate electrode is disposed on the gate insulating layer on the at least a top surface and sidewalls of the portion of the second semiconductor material region between the impurity-doped first semiconductor material regions. Source/drain regions are disposed in the second semiconductor material region on respective sides of the gate electrode. The impurity-doped first semiconductor material regions may have a different dopant concentration than the source/drain regions. In some embodiments, the gate electrode surrounds the portion of the second semiconductor material region disposed between the impurity-doped first semiconductor material regions. In other embodiments, an insulating region is disposed between the substrate and the portion of the second semiconductor material region disposed between the impurity-doped first semiconductor material regions.

In further embodiments of the present invention, the impurity-doped first semiconductor material regions include a first pair of spaced-apart impurity-doped first semiconductor material regions disposed on the substrate. The second semiconductor material region includes a first second semiconductor material region disposed on and extending between the first pair of impurity-doped first semiconductor material regions. The impurity-doped first semiconductor material regions further include a second pair of spaced-apart impurity-doped first semiconductor material regions disposed on the first second semiconductor material region. The second semiconductor material region further includes a second second semiconductor material region disposed on and extending between the second pair of impurity-doped first semiconductor material regions. The gate insulating layer conforms to at least a top surface and sidewalls of a portion of the second second semiconductor material region disposed between the second pair of impurity-doped first semiconductor material regions and sidewalls of a portion of the first second semiconductor material region disposed between the first pair of impurity-doped first semiconductor material regions. The gate electrode is disposed on the gate insulating layer on at least the top surface and sidewalls of the portion of the second second semiconductor material region between the second pair of impurity-doped first semiconductor material regions and the sidewalls of the portion of the first second semiconductor material disposed between the first pair of impurity-doped first semiconductor material regions. The source/drain regions include first and second pairs of source/drain regions in the respective first and second second semiconductor material regions, respective ones of each pair disposed on respective sides of the gate electrode.

In some method embodiments of the present invention, transistors are fabricated. An elongate stacked semiconductor structure is formed on a substrate. The stacked semiconductor structure includes a second semiconductor material region disposed on a first semiconductor material region. The first semiconductor material region is selectively doped to produce spaced-apart impurity-doped first semiconductor material regions and a lower dopant concentration first semiconductor material region therebetween. Etching exposes a portion of the second semiconductor material region between the impurity-doped first semiconductor material regions. The etching removes at least a portion of the lower dopant concentration first semiconductor material region to form a hollow between the substrate and the portion of the second semiconductor material region between the impurity-doped first semiconductor material regions. An insulation layer that surrounds the exposed portion of the second semiconductor material region between the impurity-doped first semiconductor material regions is formed. A gate electrode that conforms to the insulation layer and fills the hollow is formed. Source/drain regions are formed in the second semiconductor material regions on respective sides of the gate electrode. The doping of the impurity-doped first semiconductor material regions may provide an etching selectivity with respect to the lower dopant concentration first semiconductor material region in the etching, e.g., the selective doping may cause directional (anisotropic) etching.

The selective doping may include forming a dummy gate electrode pattern that transversely crosses the stacked semiconductor structure and implanting impurities into the first semiconductor material region using the dummy gate electrode pattern as an implantation mask. The etching may be preceded by forming an isolation region around the stacked semiconductor structure, and the etching may include forming an etching mask on the stacked semiconductor structure and the isolation region, the etching mask having an opening therein that transversely crosses the stacked semiconductor and exposes the isolation region on respective sides of the stacked semiconductor structure, and etching through the opening in the etching mask to remove portions of the isolation region and expose sidewalls of the portion of the second semiconductor material region disposed between the impurity-doped first semiconductor material regions and to form the hollow between the substrate and the portion of the second semiconductor material region between the impurity-doped first semiconductor material regions. The method may include forming a stacked semiconductor structure including more than two semiconductor material regions, and forming multiple channel regions using selective doping and etching.

In further method embodiments of the present invention, an elongate stacked semiconductor structure is formed on a substrate, the stacked semiconductor structure including a second semiconductor material region disposed on a first semiconductor material region. The first semiconductor material region is selectively doped to produce spaced-apart impurity-doped first semiconductor material regions and a lower dopant concentration first semiconductor material region therebetween. Etching exposes a portion of the second semiconductor material region between the impurity-doped first semiconductor material regions, wherein the etching removes at least a portion of the lower dopant concentration first semiconductor material region to form a hollow between the substrate and the portion of the second semiconductor material region between the impurity-doped first semiconductor material regions. An insulation layer that surrounds the exposed portion of the second semiconductor material region between the impurity-doped first semiconductor material regions is formed. An insulation region is formed in the hollow between the substrate and the portion of the second semiconductor material region between the impurity-doped first semiconductor material regions. A gate electrode that conforms to the insulation layer on top and sidewall surfaces of the portion of the second semiconductor material region between the impurity-doped first semiconductor material regions is formed. Source/drain regions are formed in the second semiconductor material regions on respective sides of the gate electrode.

BRIEF DESCRIPTION OF THE DRAWINGS

FIGS. 1A-4A are plan views of fabrication products illustrating exemplary operations for fabricating a conventional gate all around type transistor.

FIGS. 1B-4B are cross sectional diagrams of the fabrication products of FIGS. 1A-4A in an X direction.

FIGS. 1C-4C are cross sectional diagrams of the fabrication products of FIGS. 1A-4A in a Y direction.

FIGS. 6A-11A are plan views of fabrication products illustrating exemplary operations for fabricating the transistor of FIGS. 5A-5C.

FIGS. 6B-11B are cross-sectional views taken along line I-I' of FIGS. 6A-11A.

FIGS. 6C-11C are cross-sectional views taken along line II-II' of FIGS. 6A-11A.

FIGS. 13A-18A are plan views of fabrication products illustrating exemplary operations for fabricating the transistor of FIGS. 12A-12C.

FIGS. 13B-18B are cross-sectional views taken along line III-III' of FIGS. 13A-18A.

FIGS. 13C-18C are cross-sectional views taken along line IV-IV' of FIG. 13A-18A.

FIGS. 20A-25A are plan views of fabrication products illustrating exemplary operations for fabricating the transistor of FIGS. 19A-A9C.

FIGS. 20B-25B are cross-sectional views taken along line V-V' of FIGS. 20A-25A.

FIGS. 20C-25C are cross-sectional views taken along line VI-VI' of FIGS. 20A-25A.

FIGS. 27A-32A are plan views of fabrication products illustrating exemplary operations for fabricating the transistor of FIGS. 26A-26C.

FIGS. 27B-32B are cross-sectional views taken along line VII-VII' of FIGS. 27A-32A.

FIGS. 27C-32C are cross-sectional views taken along line VIII-VIII' of FIGS. 27A-32A.

DETAILED DESCRIPTION OF EXEMPLARY EMBODIMENTS

Figure 1A:
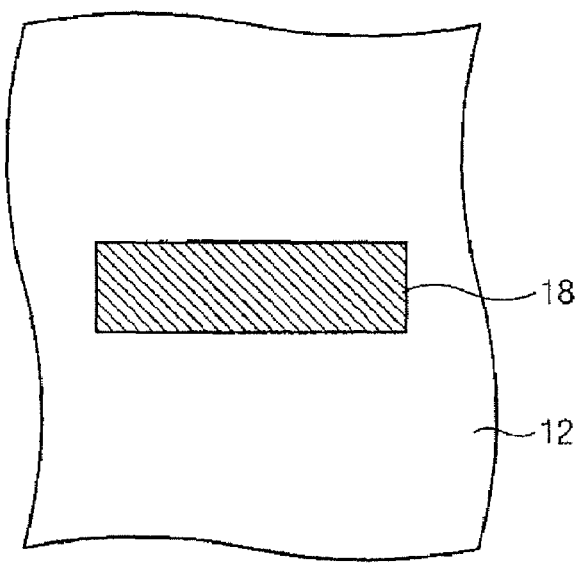
Figure 1B:
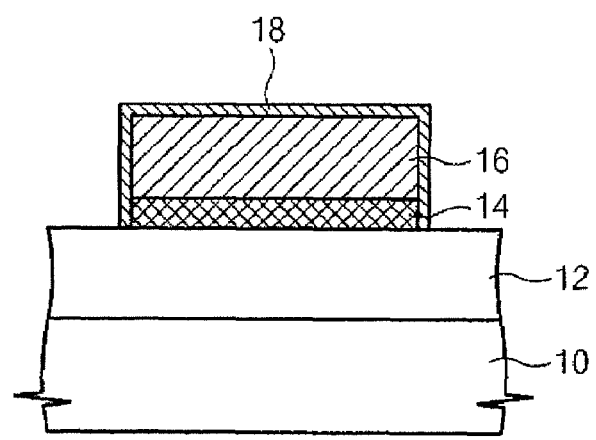
Figure 1C:
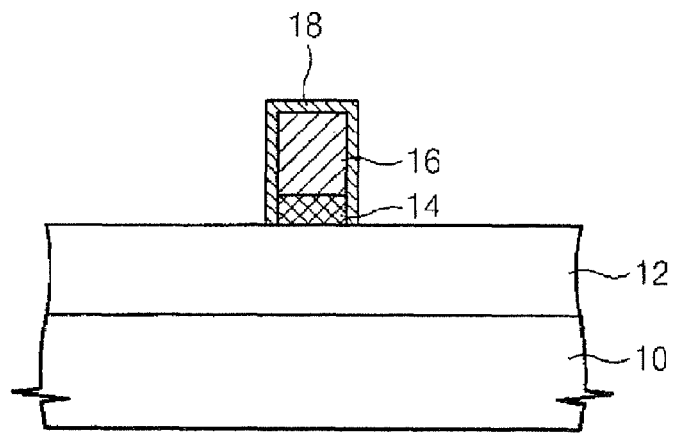
Figure 2A:
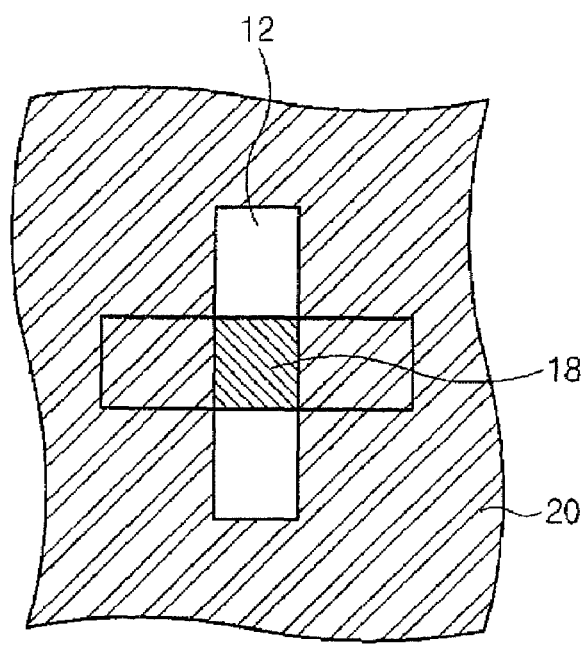
Figure 2B:
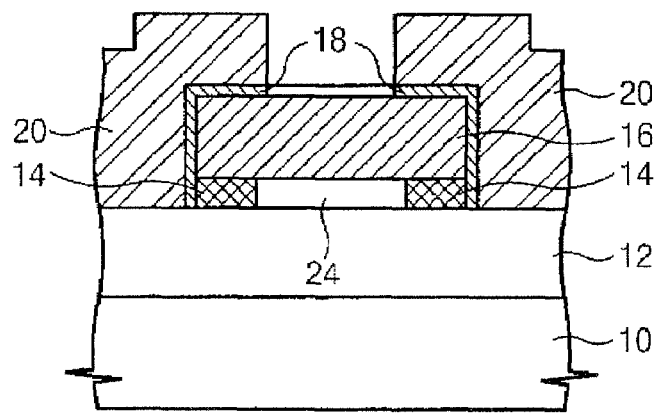
Figure 2C:
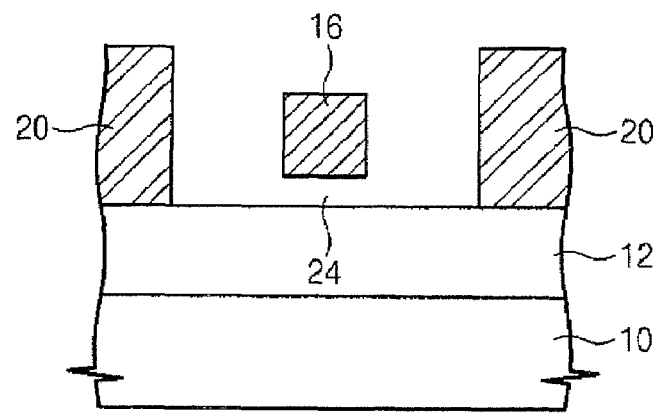
Figure 3A:
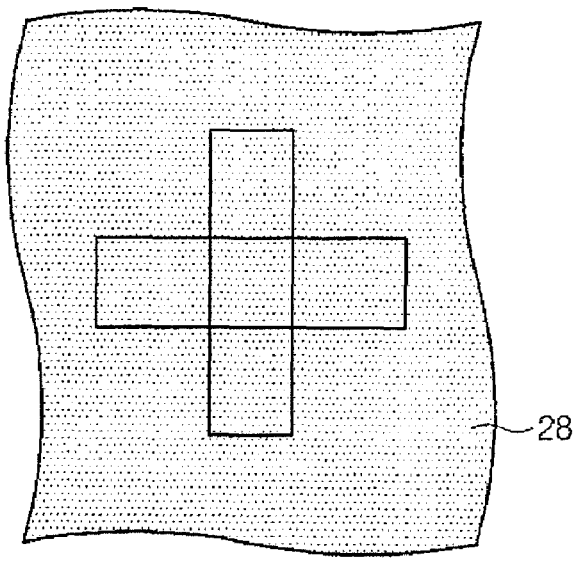
Figure 3B:
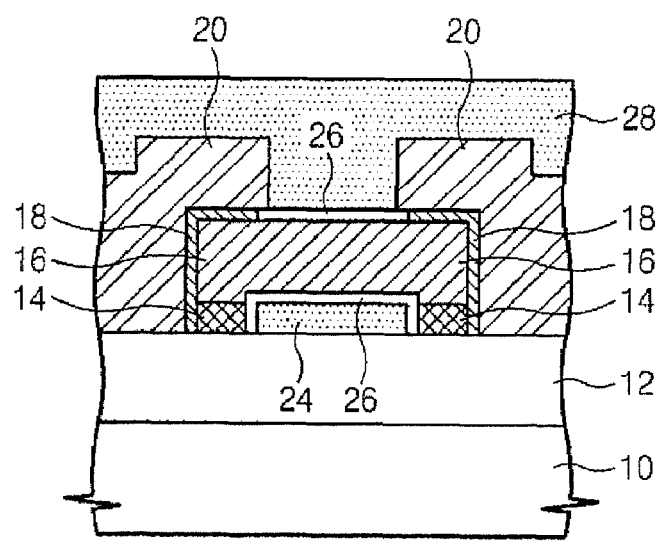
Figure 3C:
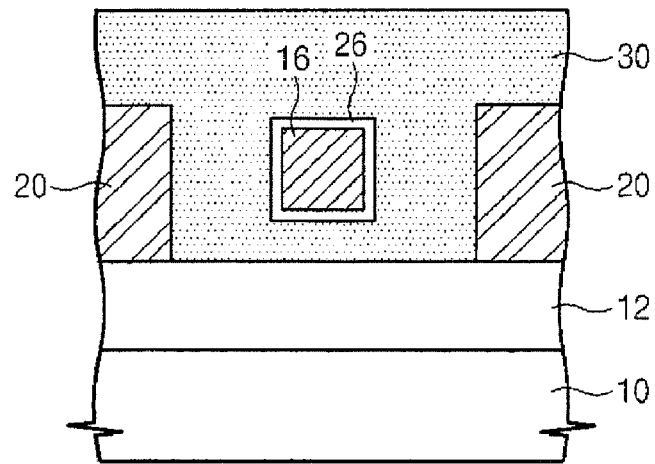
Figure 4A:
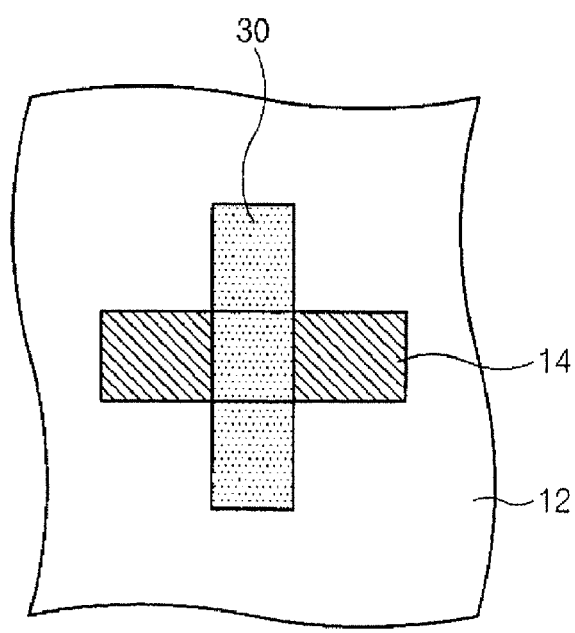
Figure 4B:
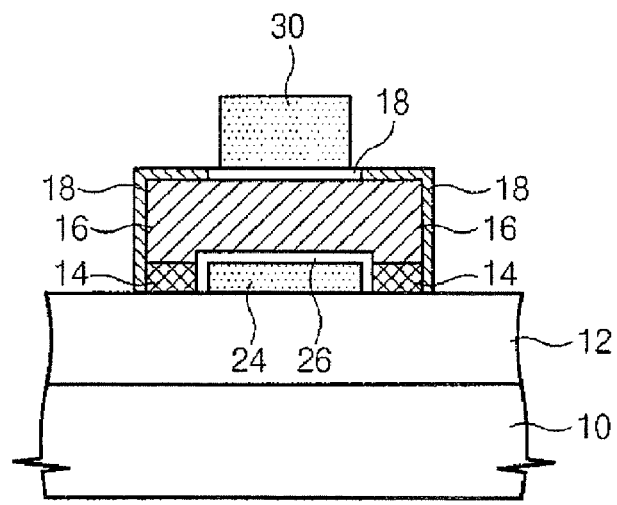
Figure 4C:
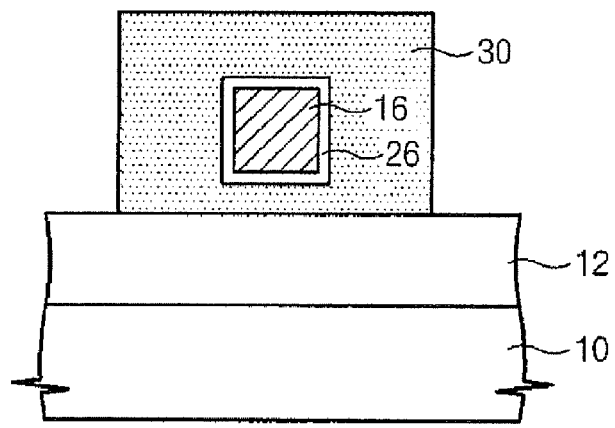

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments and is not intended to be limiting of the invention. As used herein, the singular forms "a", "an" and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout the specification.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the figures. It will be understood that relative terms are intended to encompass different orientations of the device in addition to the orientation depicted in the Figures. For example, if the device in the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section (and/or plan view) illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated or described as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. It will also be appreciated by those of skill in the art that references to a structure or feature that is disposed "adjacent" another feature may have portions that overlap or underlie the adjacent feature.

Figure 5A:
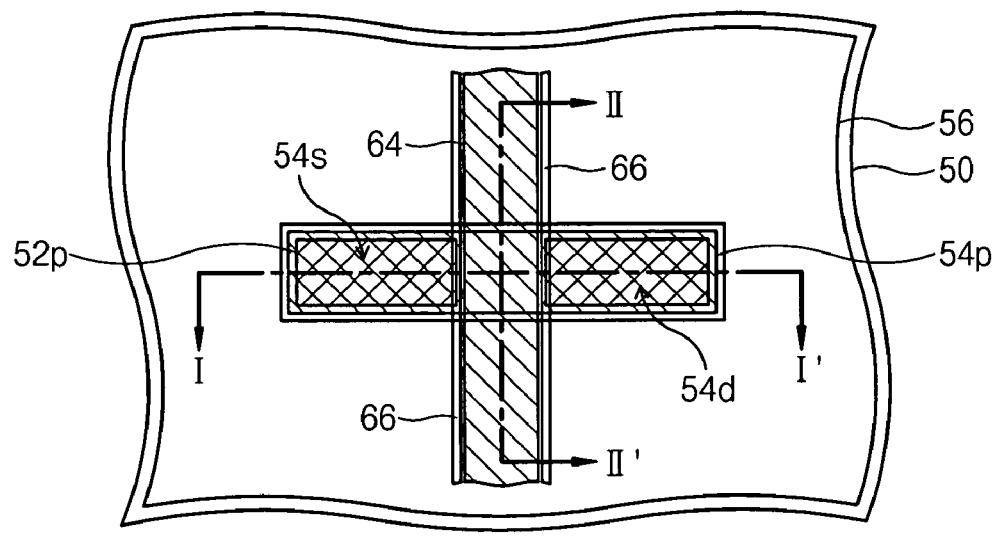
FIG. 5A is a plan view of a transistor according to first embodiments of the present invention.
Figure 5B:
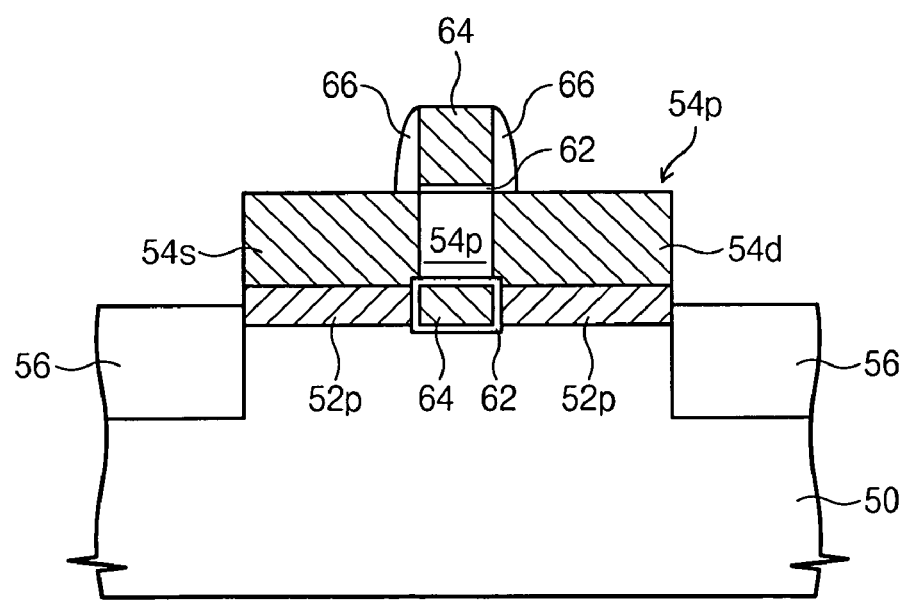
FIG. 5B is a cross-sectional view taken along line I-I' of FIG. 5A.
Figure 5C:
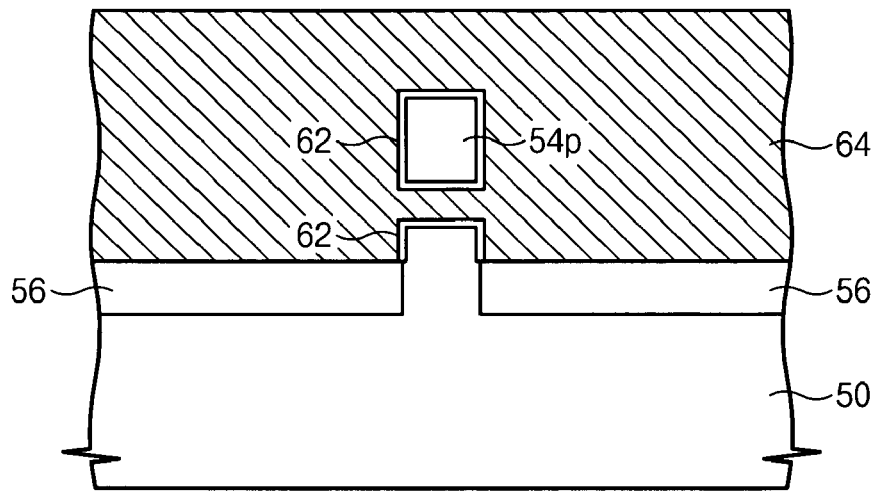
FIG. 5C is a cross-sectional view taken along line II-II' of FIG. 5A.

Referring to FIGS. 5A, 5B, and 5C, in some embodiments of the present invention, an active region vertically extends from a substrate and a device isolation layer 56 surrounds the active region. The active region includes a unit double layer, which includes a silicon-germanium pattern 52p and a silicon pattern 54p. A gate electrode 64 crosses over the active region. Portions of the active region at both sides of the gate electrode 64 include a stacked structure of the germanium pattern 52p and the silicon pattern 54p. The active region portion overlapped with the gate electrode 64 has a structure where the silicon pattern 54p is disposed over a hollow in which the germanium pattern 52p is removed. The gate electrode 64 extends along sidewalls of the silicon pattern 54p to fill in the hollow, that is, the gate electrode 64 surrounds the silicon pattern 54p. A source region 54s and the drain region 54d are formed in the silicon pattern 54p on respective sides of the gate electrode 64. Sidewall spacers 66 may be formed on sidewalls of the gate electrode 64. The source and drain regions 54s and 54d may have a lightly doped drain (LDD) or a deeply doped drain (DDD) structure. A channel width is determined according to a height of the silicon pattern 54p. A gate insulating layer 62 is interposed between the gate electrode 64 and the silicon pattern 54p. The silicon-germanium pattern 52p is doped before forming the source and drain regions 54a and 54d. The silicon-germanium pattern 52p has a dopant concentration different from the source and drain regions 54s and 54d. A top surface of the device isolation layer 56 may be recessed in order that the source and drain regions 54s and 54d are completely exposed.

Figure 6A:
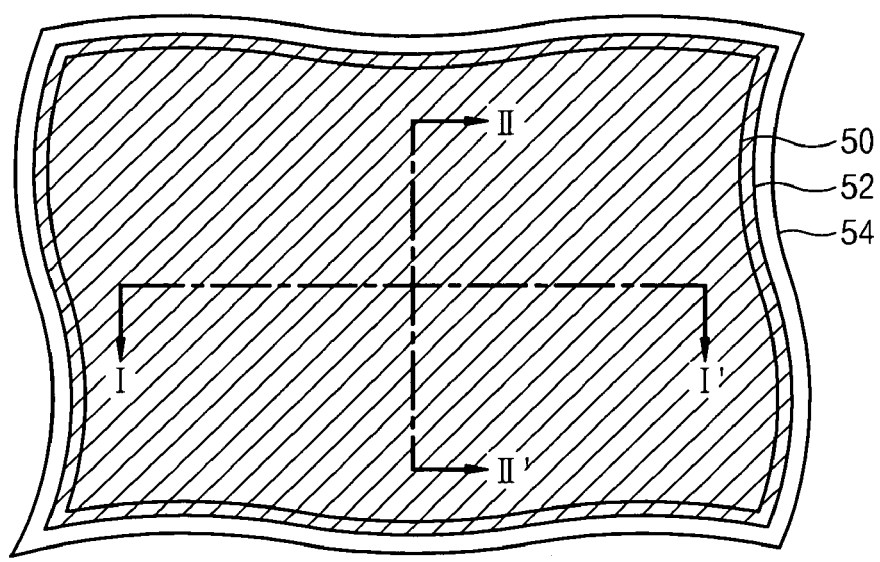
Figure 6B:
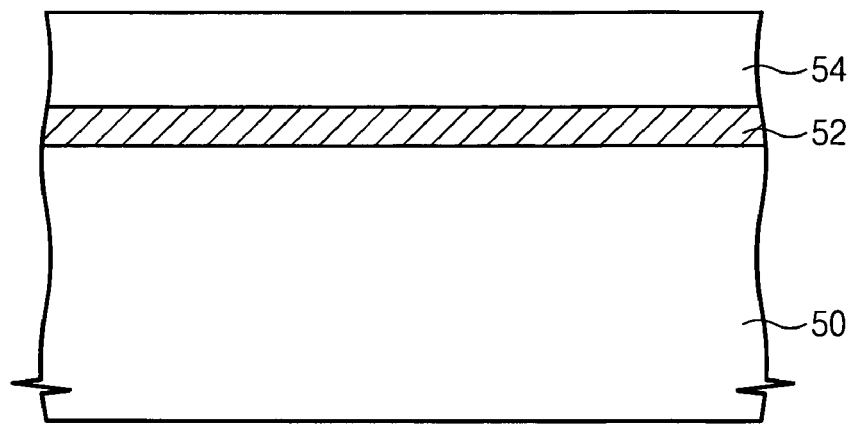
Figure 6C:
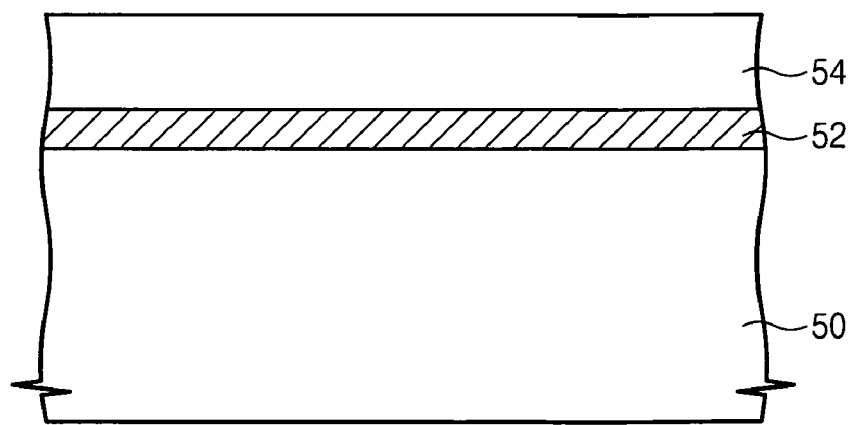

FIGS. 6A-11A are plan views of fabrication products illustrating exemplary operations for fabricating the transistor of FIGS. 5A-5C. FIGS. 6B-11B are cross-sectional views taken along line I-I' of FIGS. 6A-11A, and FIGS. 6C-11C are cross-sectional views taken along line II-II' of FIGS. 6A-11A. Referring to FIGS. 6A, 6B, and 6C, a silicon-germanium layer 52 and a silicon layer 54 are sequentially formed. The silicon-germanium layer 52 and the silicon layer 54 may be formed using, for example, an epitaxial growth method. A channel width of a transistor depends on the thickness of the silicon layer 54. The substrate 50 may be, for example, a silicon-on-insulator (SOI) substrate, a germanium-on-insulator (GeOI) substrate, or a silicon-germanium-on-insulator (SiGeOI) substrate. If the uppermost layer is formed of silicon-germanium, the silicon-germanium layer 52 may be omitted.

Figure 7A:
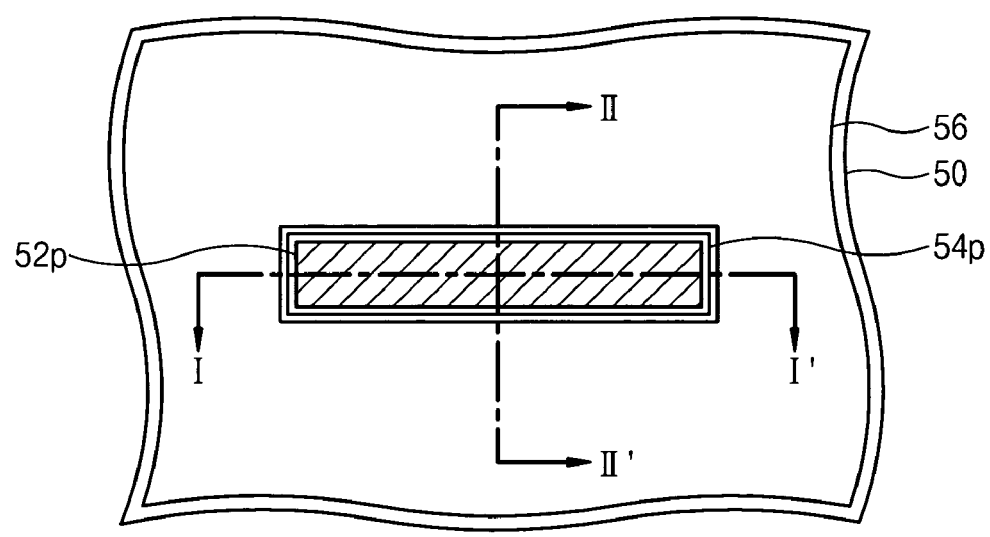
Figure 7B:
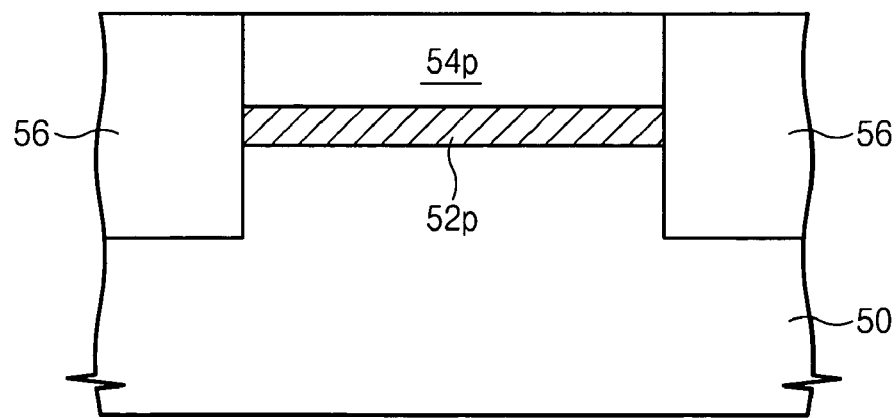
Figure 7C:
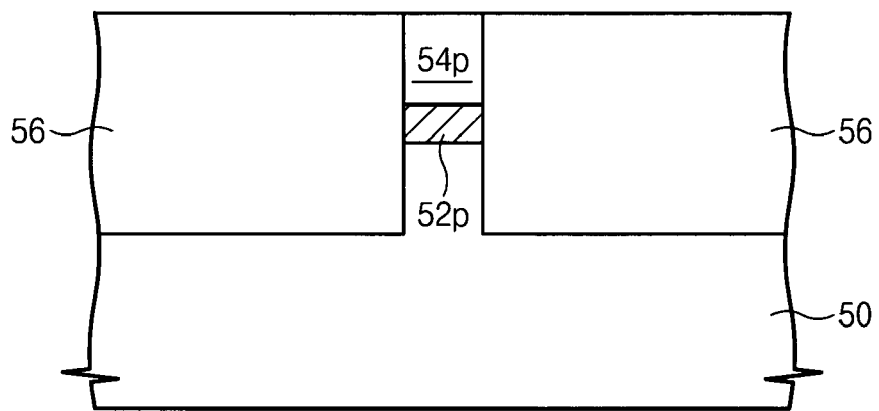

Referring to FIGS. 7A, 7B, and 7C, the silicon layer 54, the silicon-germanium layer 52, and a part of the substrate 50 are etched to form a trench, as well as a fin-shaped active region which includes a stacked structure of a silicon-germanium layer 52p and a silicon pattern 54p. A device isolation layer 56 is formed, filling in a peripheral portion of the active region and the trench. The active region may be formed using a conventional trench formation process.

Figure 8A:
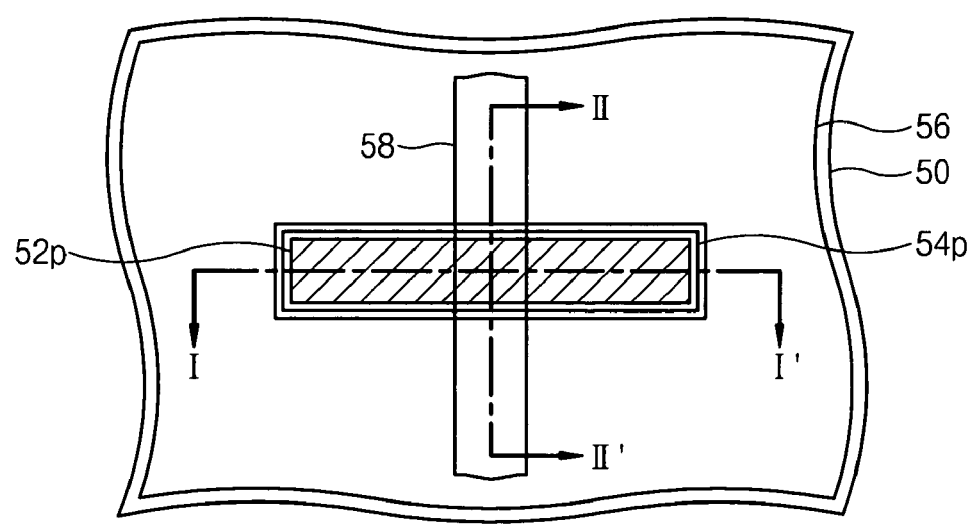
Figure 8B:
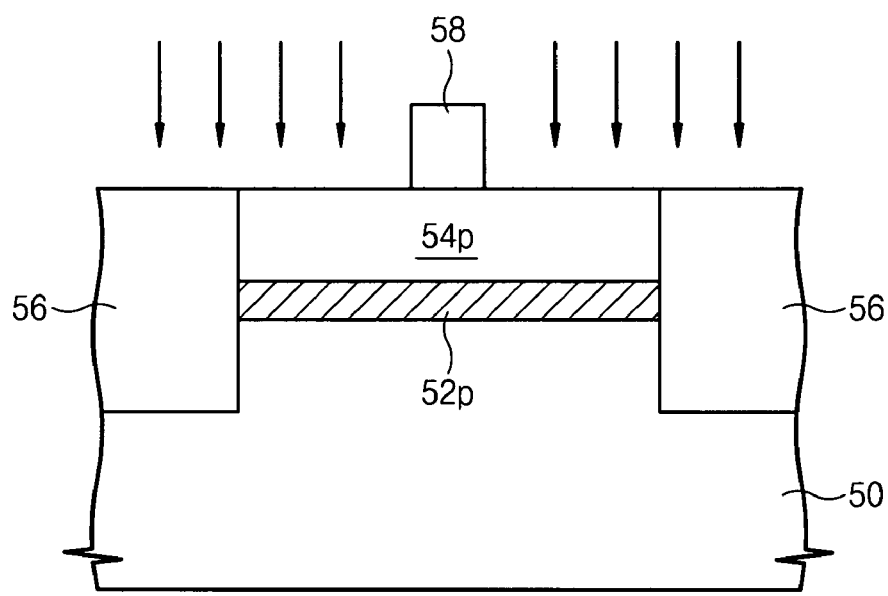
Figure 8C:
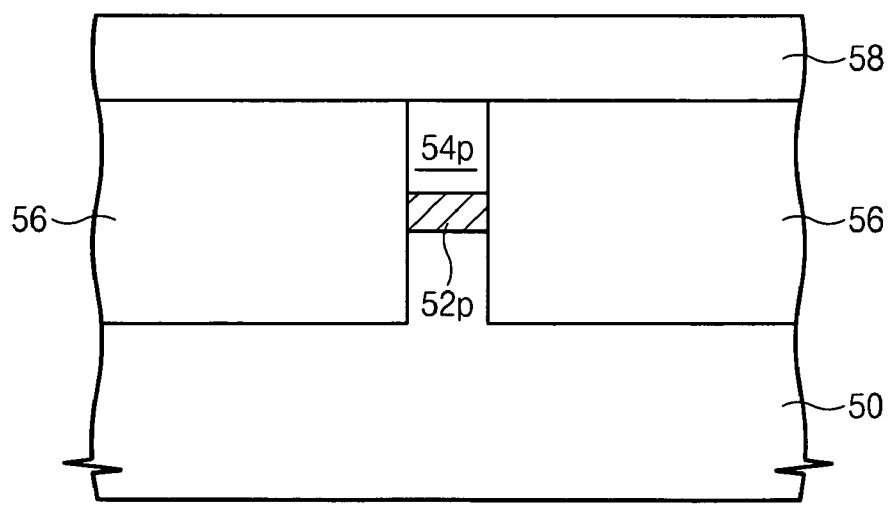

Referring to FIGS. 8A, 8B, and 8C, a dummy gate pattern 58 that crosses over the active region is formed. Ions are implanted using the dummy gate pattern 58 as an ion implantation mask. The silicon-germanium pattern 52p is doped to set a projection range of ions into the silicon-germanium pattern 52p. Silicon-germanium under the dummy gate pattern 58 is not doped.

Figure 9A:
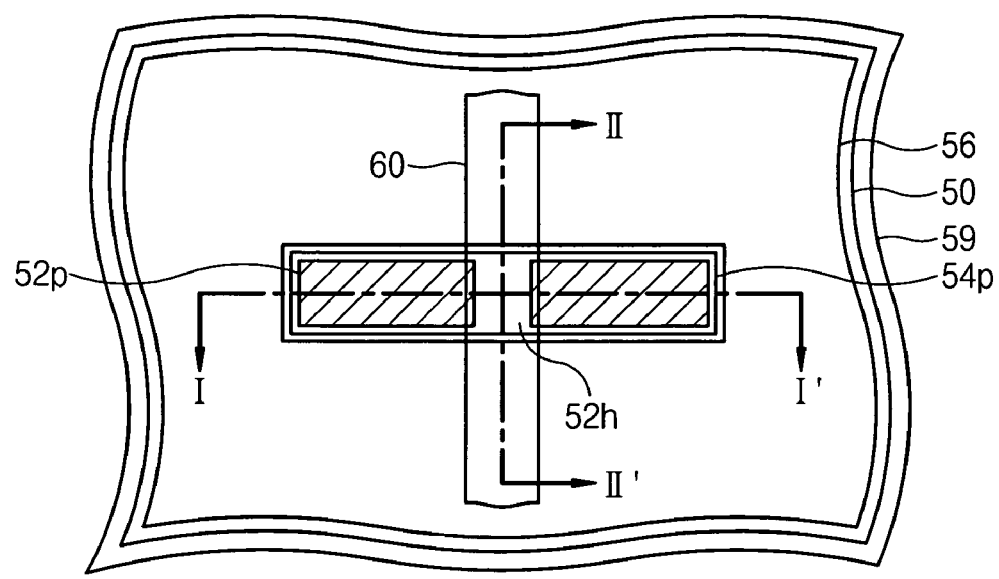
Figure 9B:
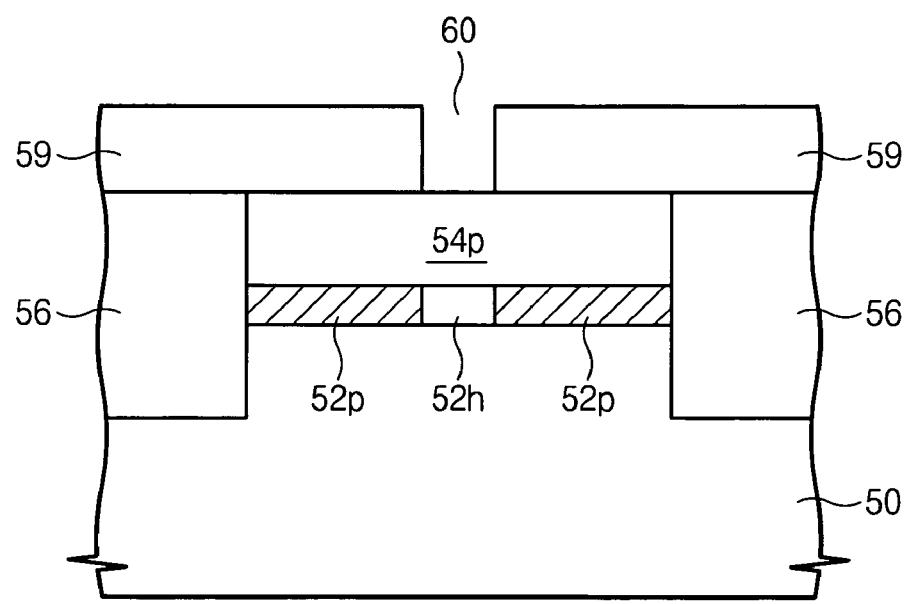
Figure 9C:
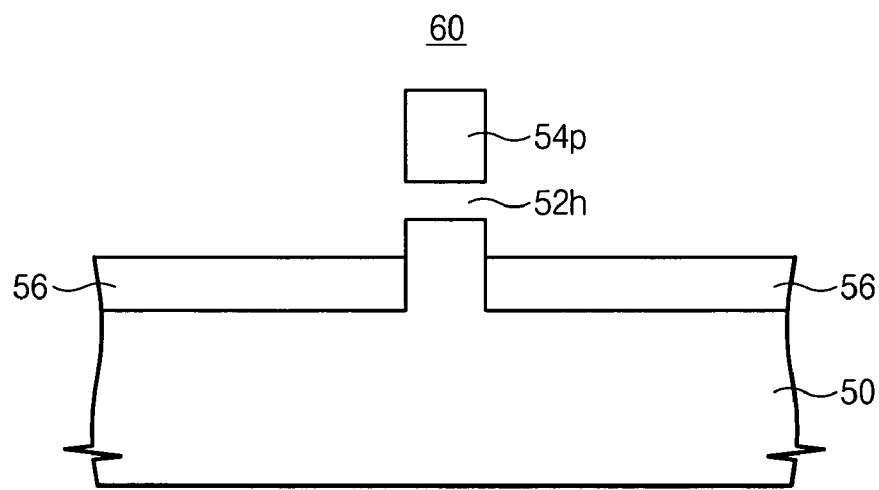

Referring to FIGS. 9A, 9B, and 9C, a sacrificial layer is formed on the substrate and then recessed to expose the dummy gate pattern 58, which is removed to form a sacrificial pattern 59 having an opening 60 that crosses over the active region. The opening corresponds to a location where a gate electrode will be subsequently formed. A portion of the device isolation layer 56 exposed at the opening 60 is etched to expose sidewalls of the active region, including sidewalls of the silicon-germanium pattern 52p. The silicon-germanium pattern 52p exposed in the opening 60 is etched to form a hollow 52h. Silicon-germanium is selectively removed using an etch ratio difference according to a doping concentration of silicon-germanium, thus suppressing lateral etching and providing a directional (anisotropic) etching effect.

Figure 10A:
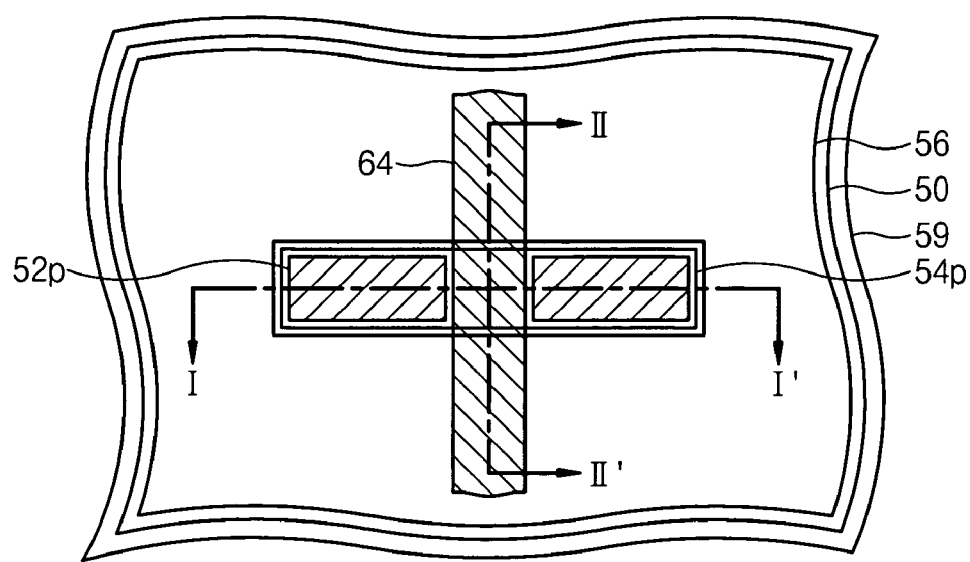
Figure 10B:
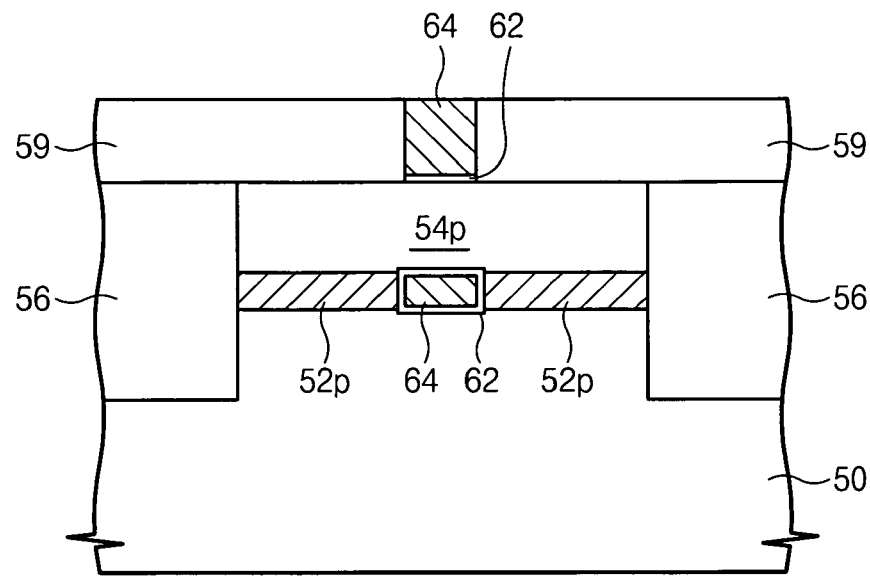
Figure 10C:
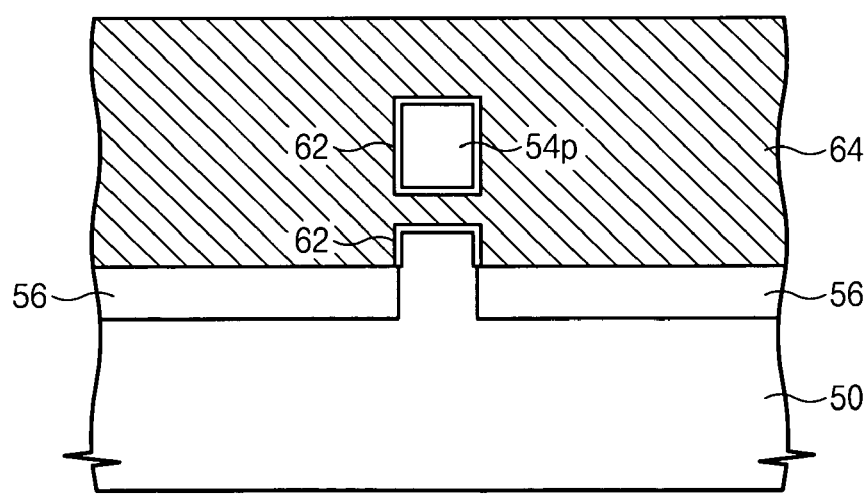

Referring to FIGS. 10A, 10B, and 10C, a gate oxide layer is conformally formed on a surface of the silicon pattern 54p exposed in the opening 60. A conductive layer is formed on the substrate. The conductive layer may include, for example, amorphous or polysilicon, polysilicon germanium and/or metal materials. The conductive layer fills in the hollow 52h. For example, silicon or silicon-germanium may be formed in the hollow and covering sidewalls of the silicon pattern 54p using a chemical vapor deposition method. The conductive layer is removed using a CMP process or an etch-back process until the sacrificial layer is exposed and a gate electrode 64 is formed.

In a conventional process, there may be a great difference between the width of the gate electrode in the hollow and the width of the gate electrode over the silicon layer due to an isotropic etch of silicon-germanium. Generally, the greater the width of the active region, the greater the difference is. In accordance with certain embodiments of the present invention, because silicon-germanium is anisotropically removed using an etch ratio difference created by a doping concentration, this difference can be reduced.

Figure 11A:
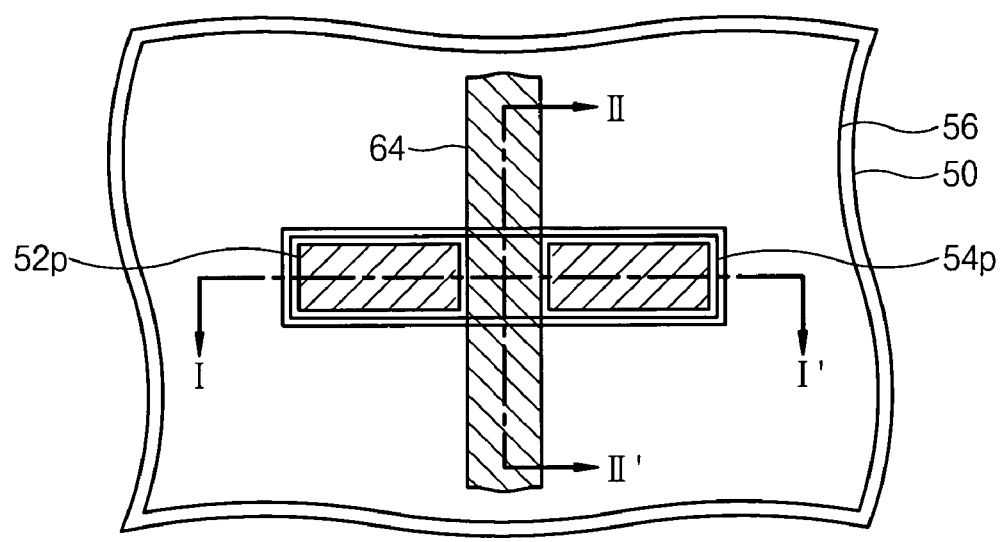
Figure 11B:
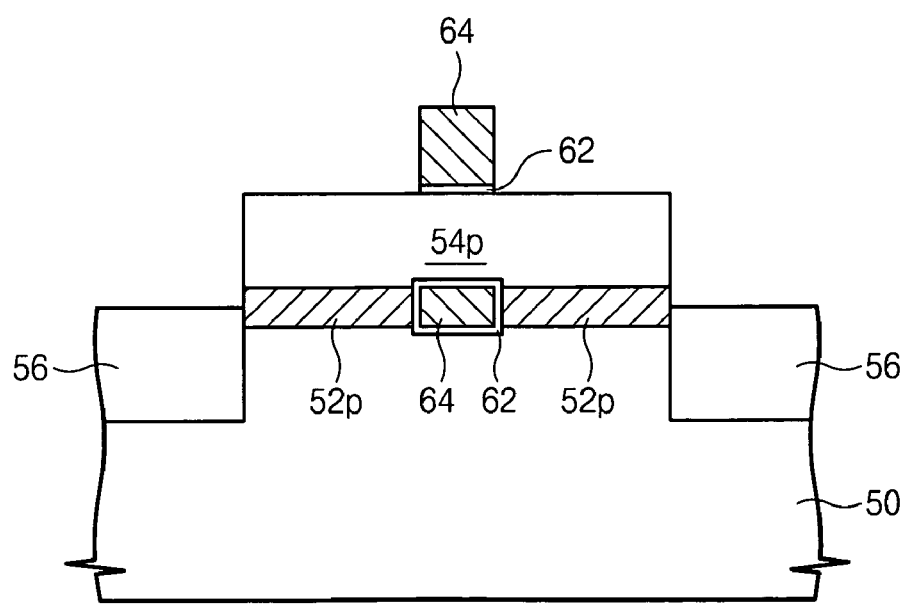
Figure 11C:
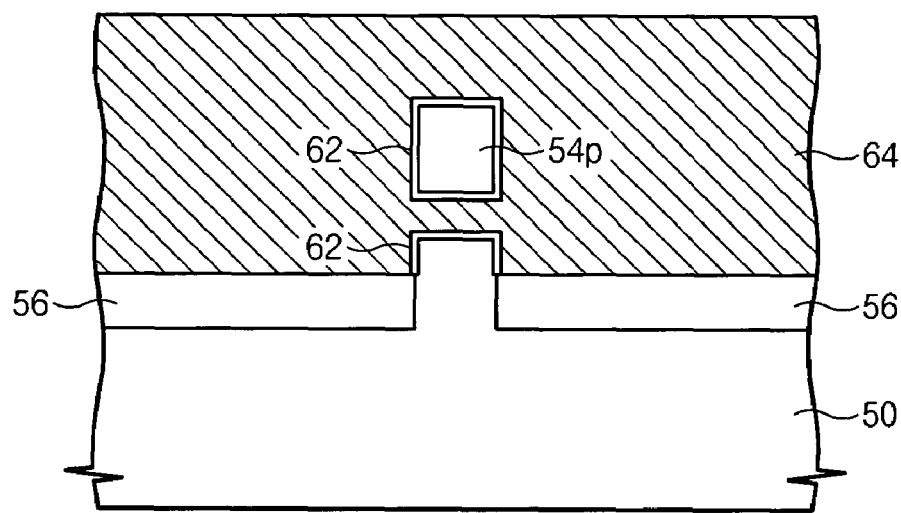

Referring to FIGS. 11A, 11B, and 11C, the sacrificial pattern 59 is removed to expose sidewalls of the gate electrode 64, the active region, and the device isolation layer. The device isolation layer 56 is recessed to expose sidewalls of the active region such that sidewalls of the silicon pattern 54p surrounded by the gate electrode 64 are exposed. Because the silicon-germanium pattern 52p does not influence an operation of the transistor, it is generally not important for the silicon-germanium pattern 52p to be exposed.

Impurities are implanted into the silicon pattern 54p at both sides of the gate electrode 64 to form the source/drain regions 54s and 54d that are shown in FIGS. 5A, 5B, and 5C. In addition, sidewall spacers 66 may be formed on sidewalls of the gate electrode 64. In a gate all around type transistor, a short channel effect may occur. However, in a transistor having a fully depleted channel, a short channel effect may be prevented. Accordingly, a drain with LDD structure or DDD structure may be formed. Before or after forming the sidewall spacers 66, the drain with LDD structure or DDD structure may be formed.

Figure 12A:
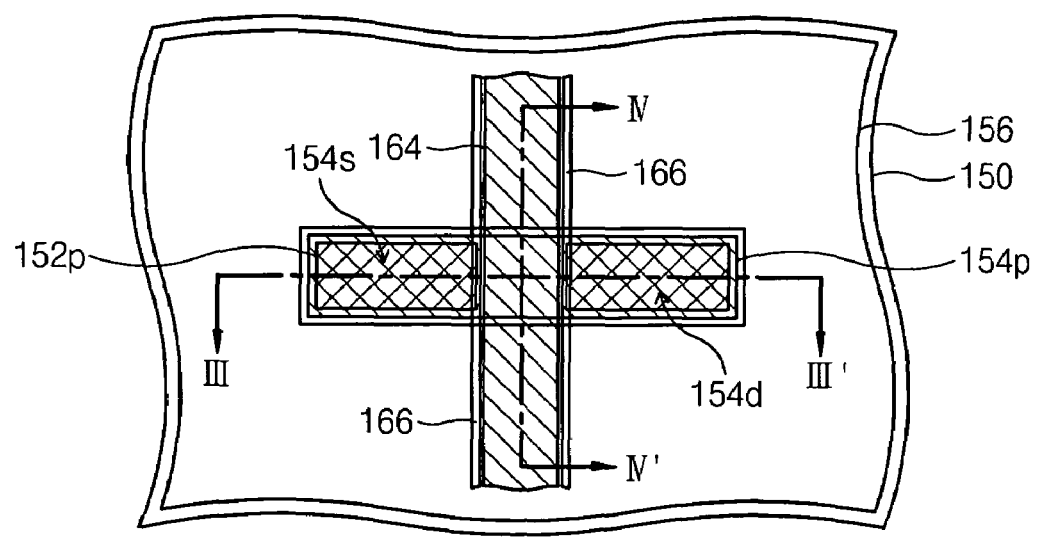
FIG. 12A is a plan view of a transistor according to second embodiments of the present invention.
Figure 12B:
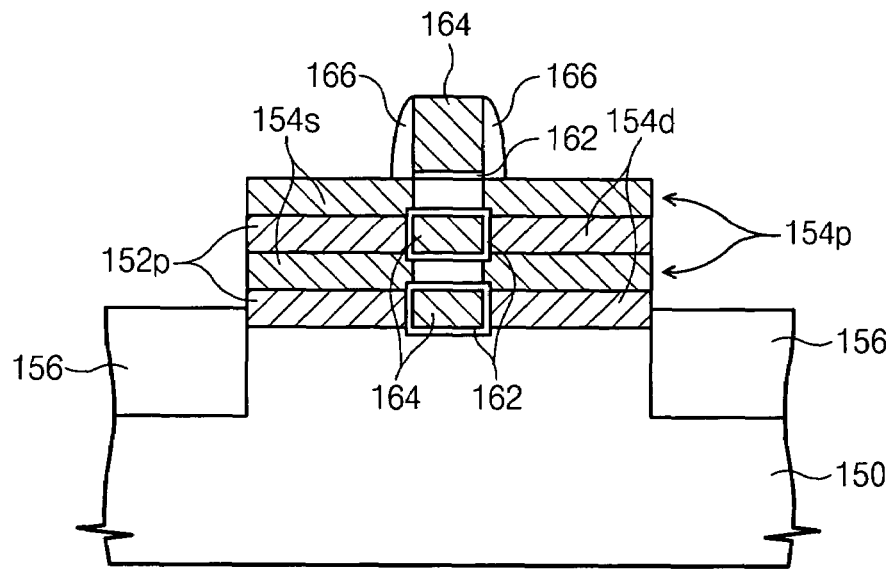
FIG. 12B is a cross-sectional view taken along line III-III' of FIG. 12A.
Figure 12C:
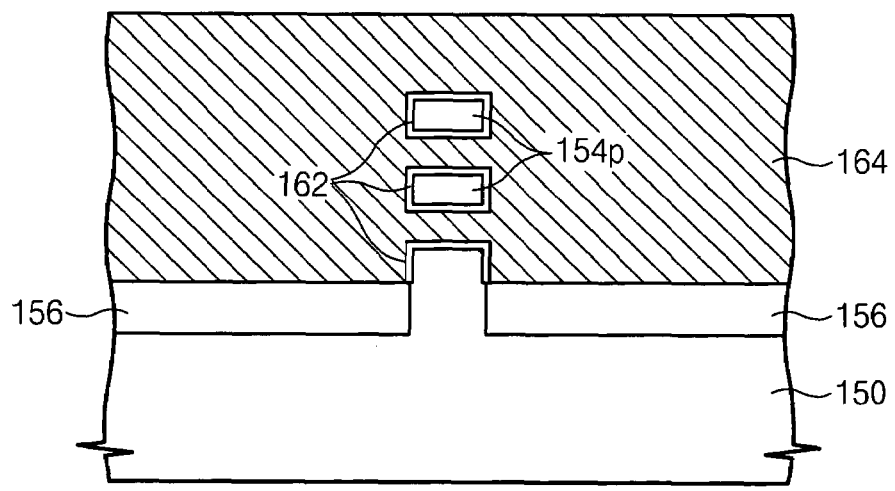
FIG. 12C is a cross-sectional view taken along line IV-IV' of FIG. 12A.

FIG. 12A is a plan view of a transistor according to second embodiments of the present invention. FIG. 12B is a cross-sectional view taken along line III-III' of FIG. 12A, and FIG. 12C is a cross-sectional view taken along line IV-IV' of FIG. 12A. Referring to FIGS. 12A, 12B, and 12C, an active region vertically extends from a substrate and a device isolation layer surrounds the active region. The active region includes a unit double layer included of a silicon-germanium pattern 152p and a silicon pattern 154p. A gate electrode 164 crosses over the active region. Portions of the active region on respective sides of the gate electrode 164 include a stack of the silicon-germanium pattern 152p and silicon pattern 154p. A portion of the active region overlapped with the gate electrode 164 has a structure in which respective silicon patterns 154p are adjacent hollows where the germanium pattern 152p is removed. The gate electrode 164 extends along sidewalls of the silicon pattern 154p to fill in the hollows, such that the gate electrode 164 surrounds the silicon pattern 154p. Source/drain regions 154a and 154d are formed in the silicon pattern 154p at respective sides of the gate electrode 164. Sidewall spacers 166 may be formed at sidewalls of the gate electrode 164. The source/drain regions 154s and 154d may have an LDD structure or a DDD structure. A channel width is determined by a height of the silicon pattern 154p. A gate insulating layer 162 is interposed between the gate electrode 164 and the silicon pattern 154p. The silicon-germanium pattern 152p is doped before forming the source/drain regions 154s and 154d. The silicon-germanium pattern 152p is doped with a concentration different from the source/drain regions 154s and 154d.

Figure 13A:
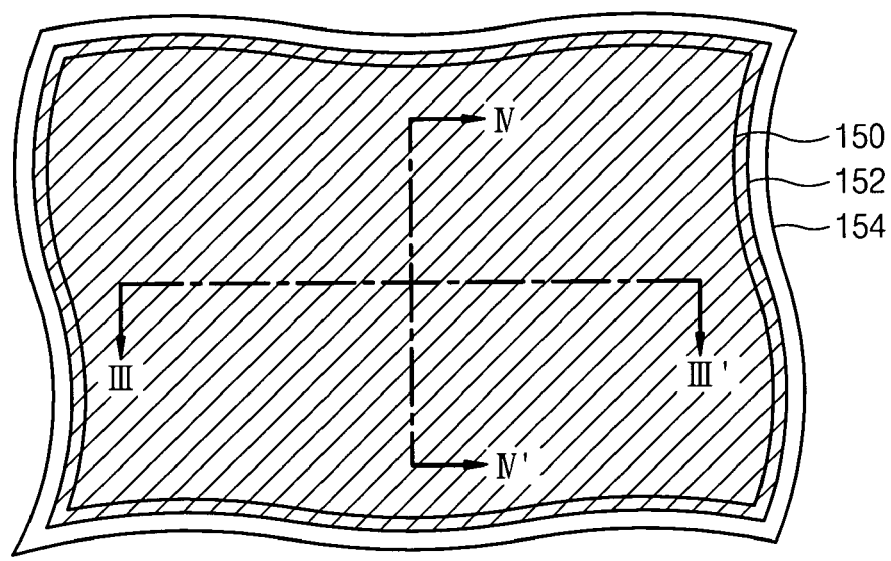
Figure 13B:
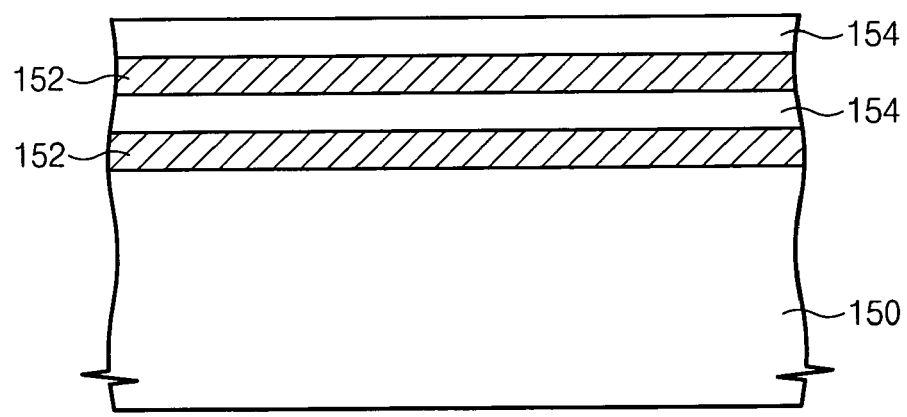
Figure 13C:
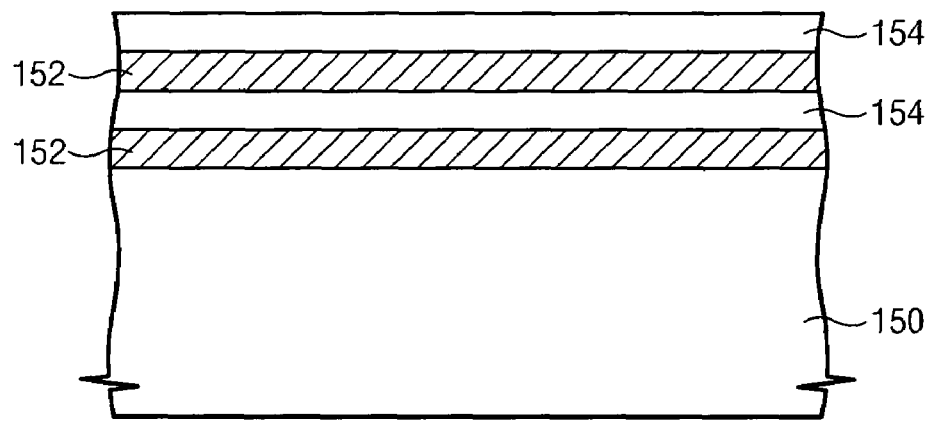

FIGS. 13A-18A are plan views of fabrication products illustrating exemplary operations for fabricating the transistor of FIGS. 12A-12C. FIGS. 13B-8B are cross-sectional views taken along line III-III' of FIGS. 13A-18A, and FIGS. 13C-18C are cross-sectional views taken along line IV-IV' of FIG. 13A-18A. Referring to FIGS. 13A, 13B, and 13C, a plurality of unit double layers, which include a stack of a silicon-germanium layer 152 and a silicon layer 154, are formed on a substrate 150. The silicon-germanium layer 152 and the silicon layer 154 may be formed using an epitaxial growth method. The channel width of a transistor depends on the thickness of the silicon layer 154. The substrate 150 may be, for example, a silicon-on-insulator (SOI) substrate, a germanium-on-insulator (GeOI) substrate, or a silicon-germanium-on-insulator (SiGeOI) substrate. If the uppermost layer of the substrate 150 is silicon-germanium, the lower silicon-germanium layer 152 may be omitted.

Figure 14A:
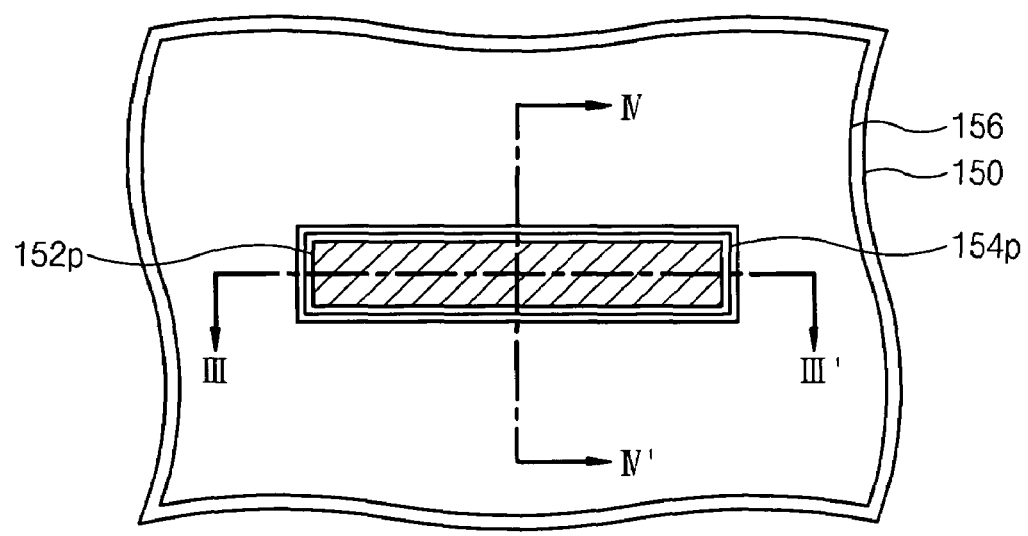
Figure 14B:
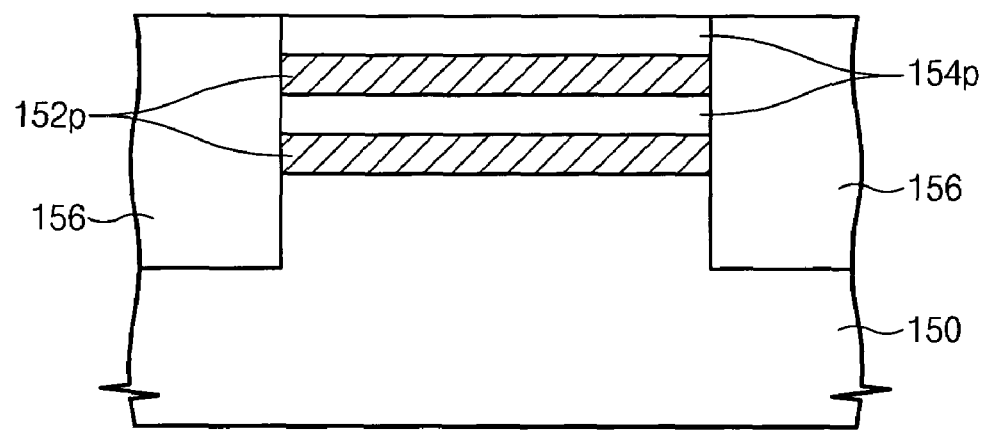
Figure 14C:
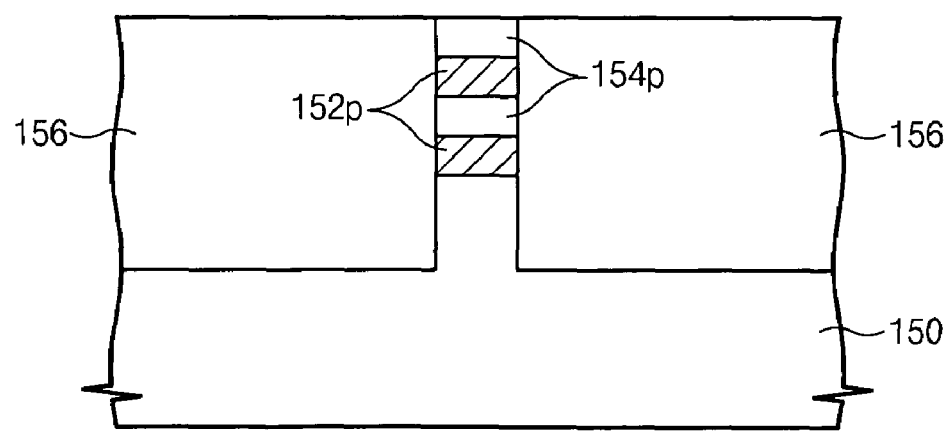

Referring to FIGS. 14A, 14B, and 14C, the stacked unit double layer and a part of the substrate are etched to form a trench and at the same time, to form a plurality of silicon-germanium patterns 152p and a fin-shaped active region in which a plurality of silicon patterns 154p are stacked. A device isolation layer 156 is formed at a peripheral portion of the active region. The active region may be formed using a conventional trench formation process.

Figure 15A:
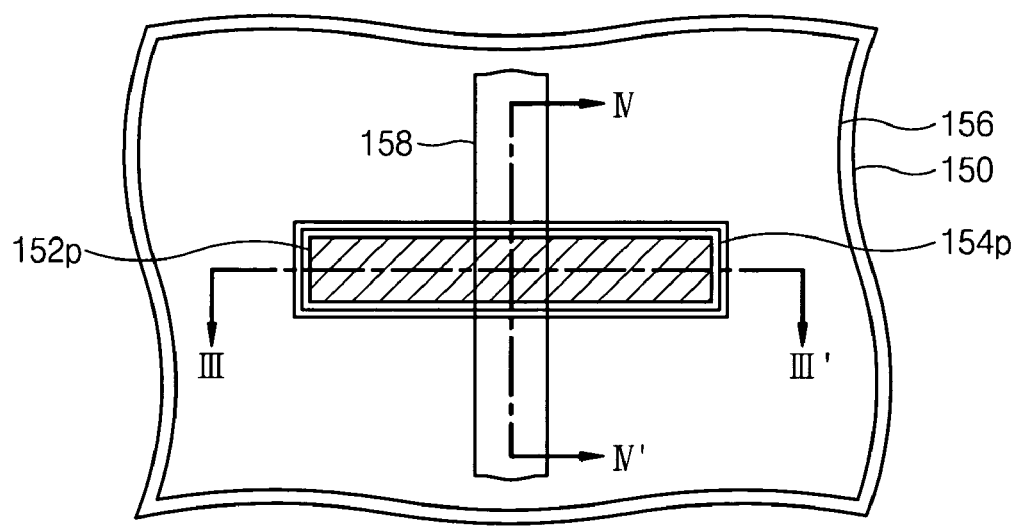
Figure 15B:
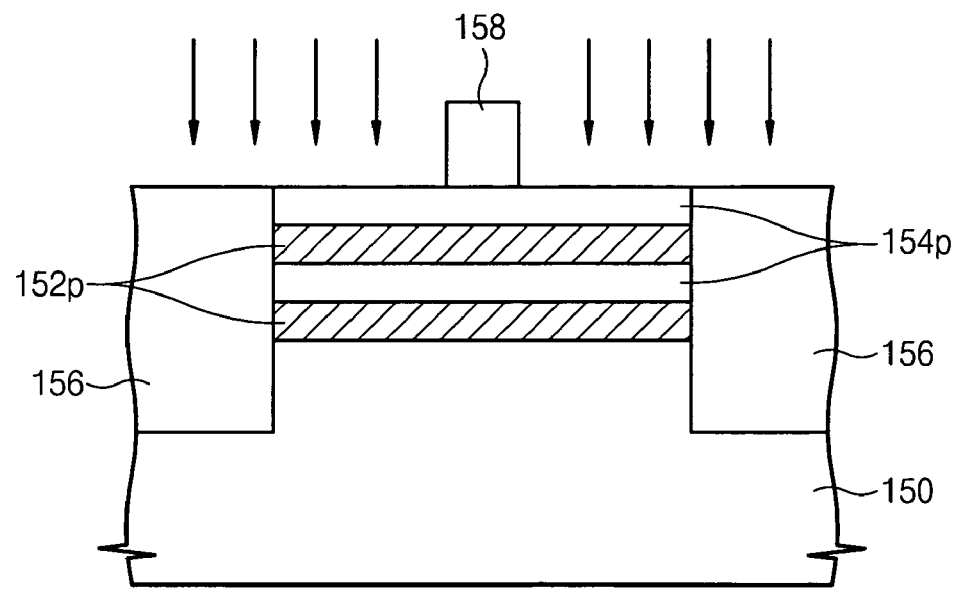
Figure 15C:
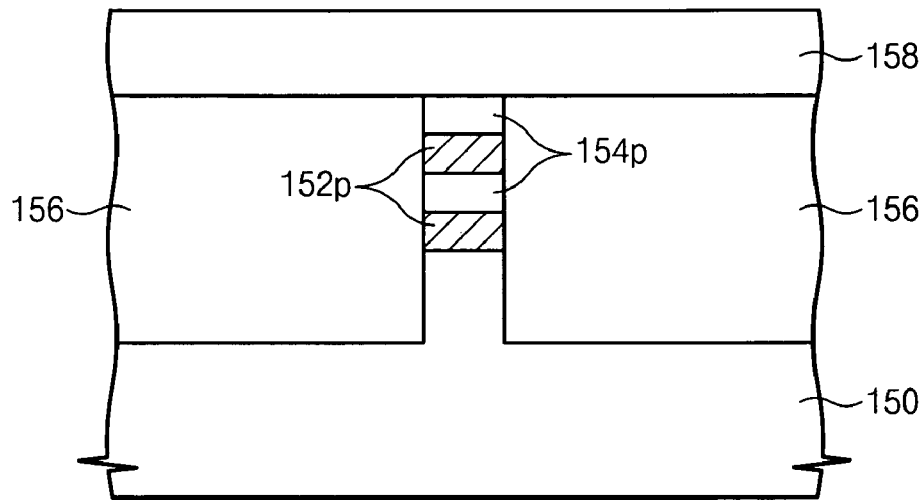

Referring to FIGS. 15A, 15B, and 15C, a dummy gate pattern 158 that crosses over the active region is formed. Ions are implanted into the active region using the dummy gate pattern 158 as an ion implantation mask. The silicon-germanium pattern 152p is doped in setting a projection range of ions to the germanium pattern 152p. A plurality of ion implantation processes may be sequentially performed to set a projection range into the silicon germanium pattern 152p in each layer. The silicon-germanium pattern under the dummy gate pattern 158 is not doped.

Figure 16A:
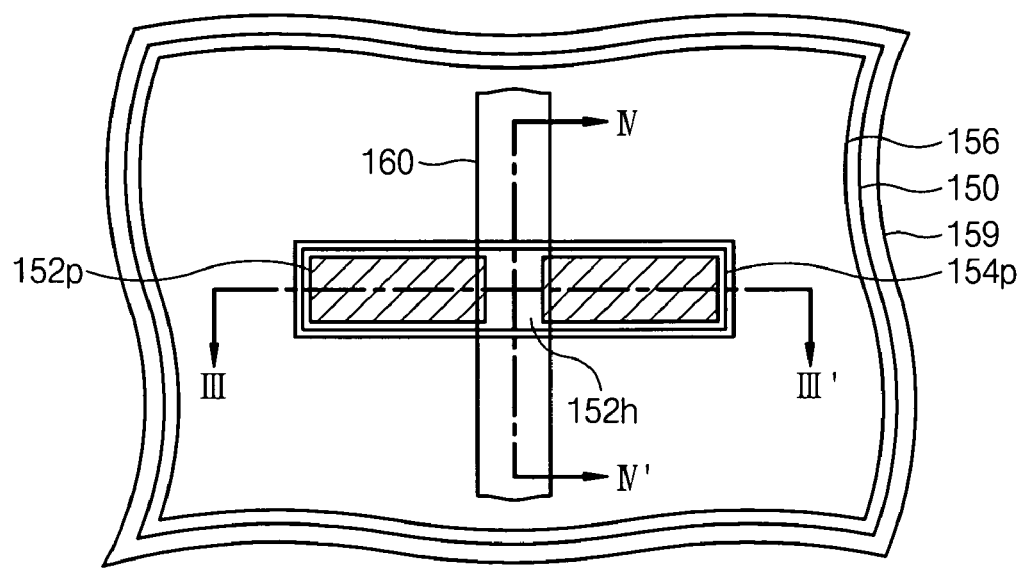
Figure 16B:
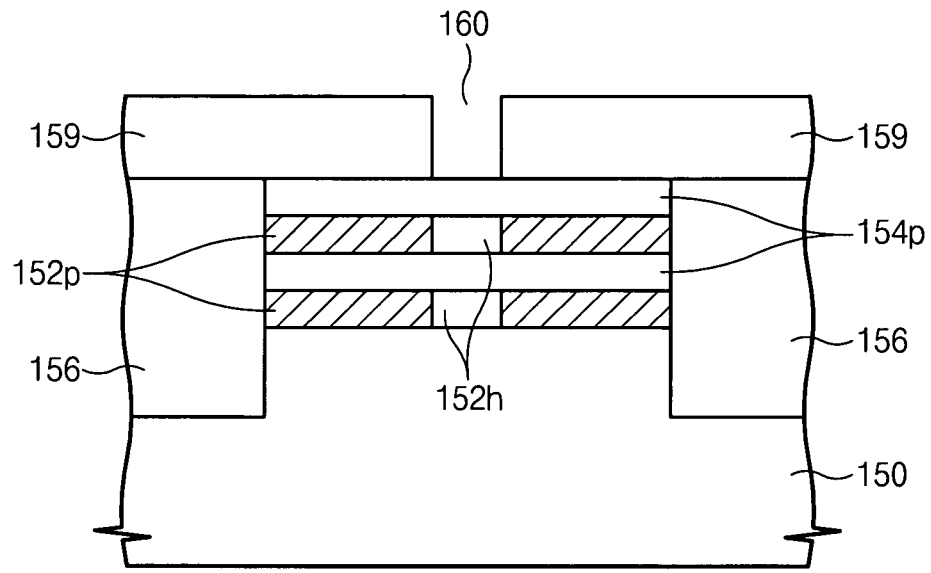
Figure 16C:
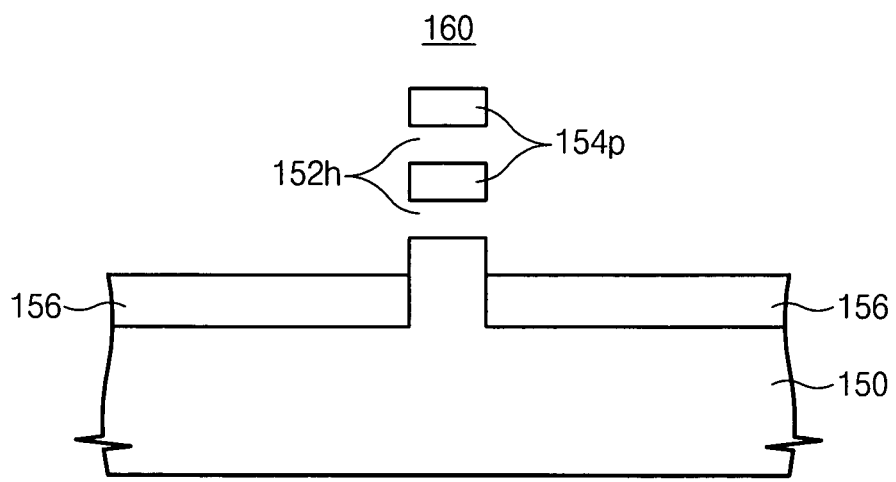

Referring to FIGS. 16A, 16B, and 16C, a sacrificial layer is formed on the substrate. The sacrificial layer is recessed to expose the dummy gate pattern 158, and the dummy gate pattern is removed to form a sacrificial pattern 159 having an opening 160 crossing over the active region. The opening 160 is located where a gate electrode is subsequently formed. The device isolation layer 156 exposed at the opening 160 is etched to expose sidewalls of the active region, that is, sidewalls of the silicon pattern 154p and the silicon-germanium pattern 152p. The silicon-germanium patterns 152p exposed at the opening 160 are etched to form a plurality of hollows 152h.

Figure 17A:
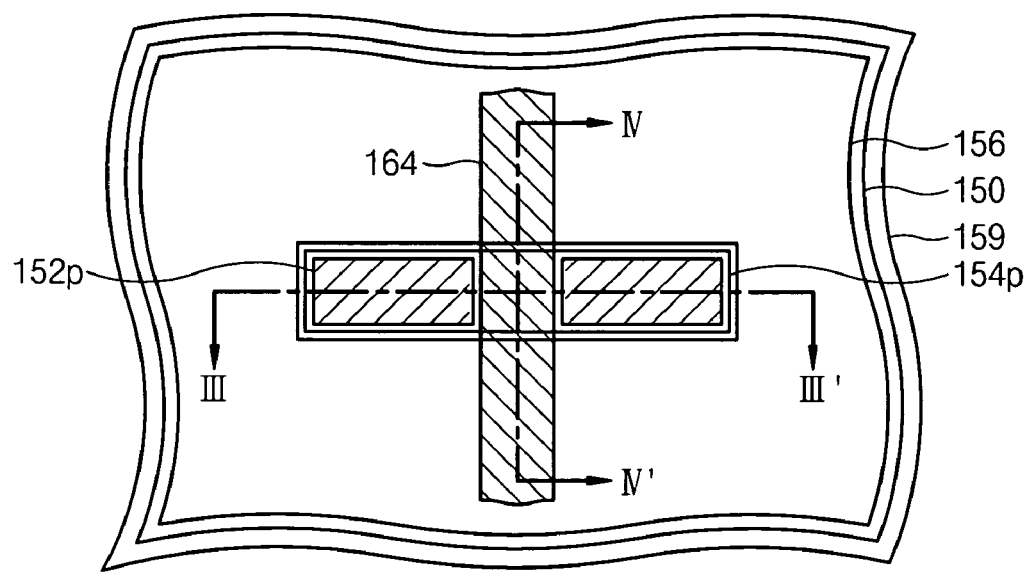
Figure 17B:
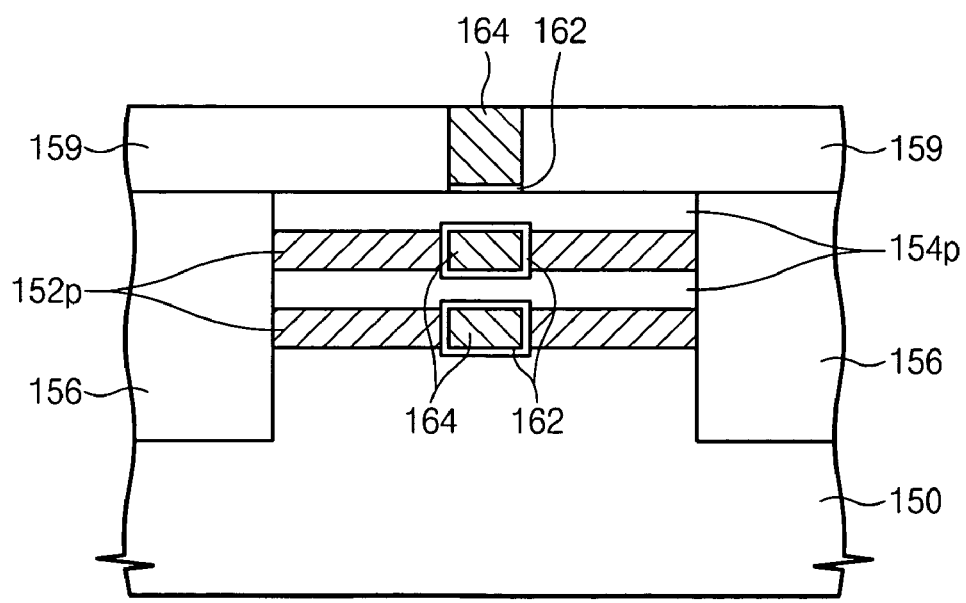
Figure 17C:
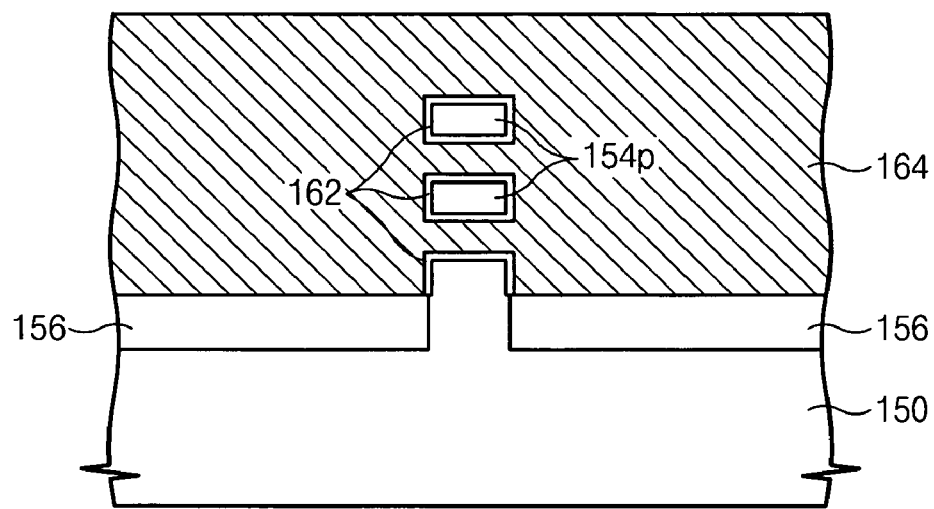

Referring to FIGS. 17A, 17B, and 17C, a gate oxide layer is conformally formed on the silicon patterns 154p exposed in the opening 160. A conductive layer is formed on the substrate, filling the hollows 152h. The conductive layer may be amorphous silicon or polysilicon, polysilicon germanium or metal materials. The conductive layer is removed using CMP or etch-back process until the sacrificial layer is exposed and a gate electrode 164 is formed.

Figure 18A:
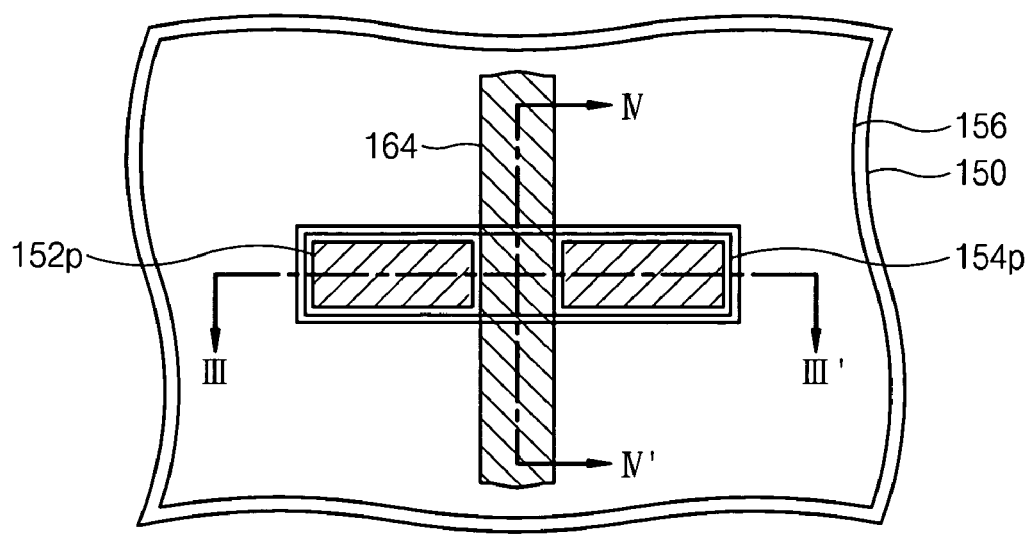
Figure 18B:
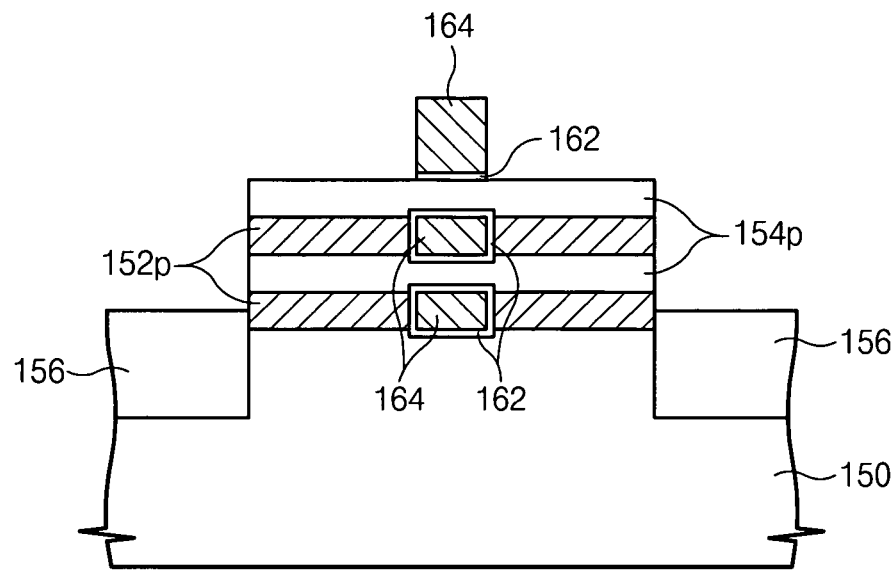
Figure 18C:
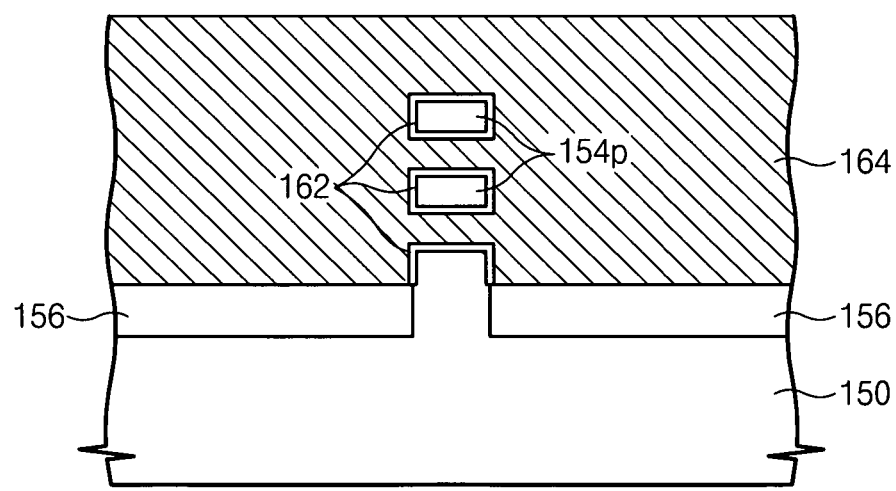

Referring to FIGS. 18A, 18B, and 18C, the sacrificial pattern 159 is removed to expose sidewalls of the gate electrode 164, the active region, and the device isolation layer. The device isolation layer is recessed to expose sidewalls of the active region and to expose the sidewalls of the silicon pattern 154p covered with the gate electrode 164. Because the silicon-germanium pattern 52p does not influence operation of the transistor, it generally is not important whether or not the silicon-germanium pattern 52p is exposed.

Impurities are implanted into the silicon pattern 154p at respective sides of the gate electrode 164 to form the source/drain regions 154s and 154d shown in FIGS. 12A, 12B, and 12C. In addition, sidewall spacers 166 may be formed on sidewalls of the gate electrode 164. In a gate all around type transistor, a short channel effect may occur. In a transistor having a fully depleted channel, a short channel effect may be prevented. Accordingly, a drain with LDD structure or DDD structure may be formed. Before/after forming the sidewall spacer 66, the drain with LDD structure or DDD structure may be formed.

Figure 19A:
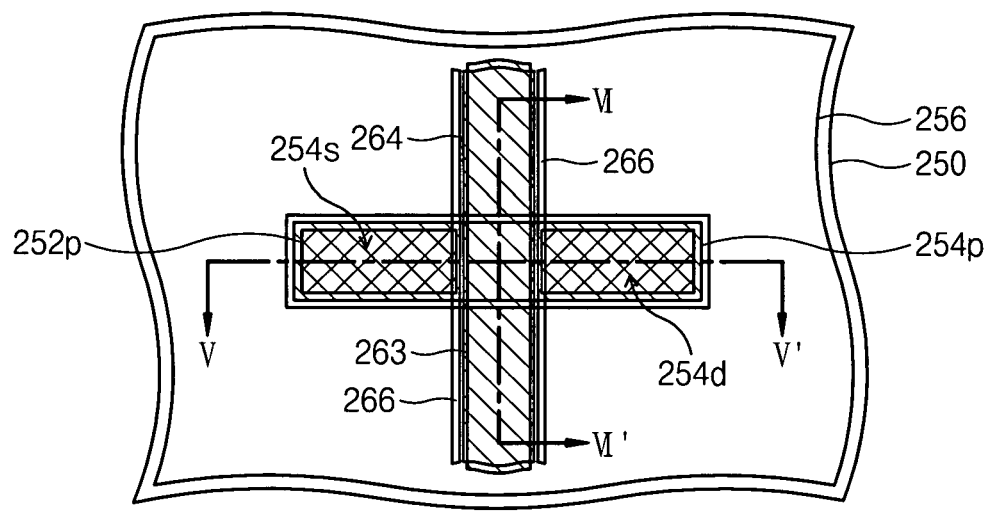
FIG. 19A is a plan view of a transistor according to third embodiments of the present.
Figure 19B:
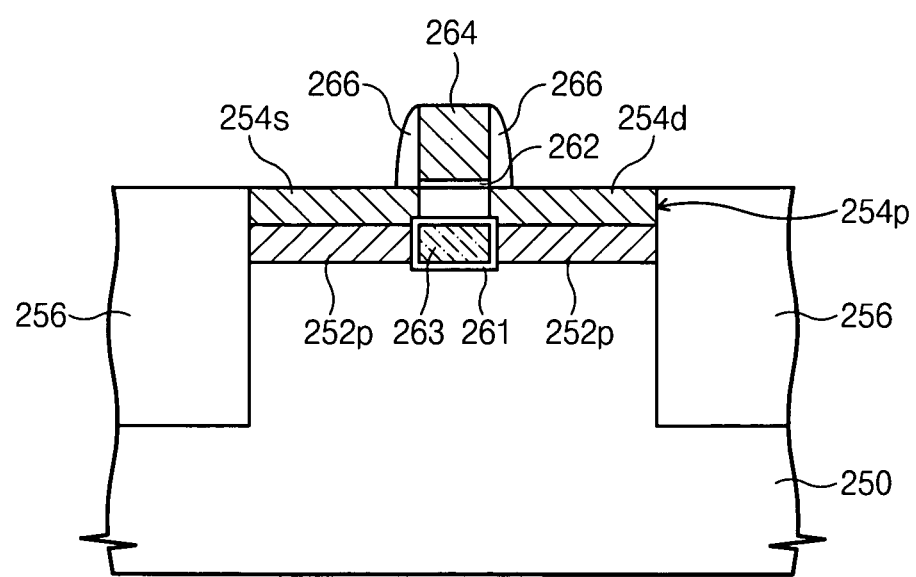
FIG. 19B is a cross-sectional view taken along line V-V' of FIG. 19A.
Figure 19C:
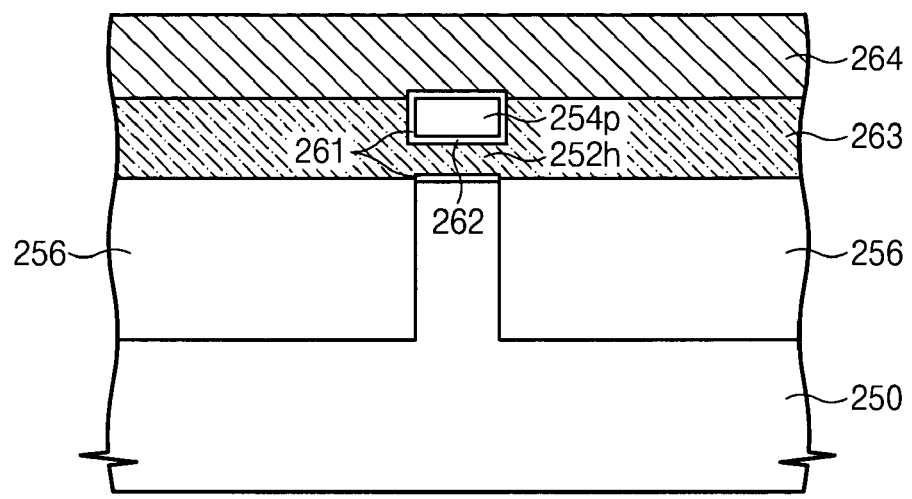
FIG. 19C is a cross-sectional view taken along line VI-VI' of FIG. 19A.

FIG. 19A is a plan view illustrating a transistor according to third embodiments of the present invention. FIG. 19B is a cross-sectional view taken along line V-V' of FIG. 19A, and FIG. 19C is a cross-sectional view taken along line VI-VI' of FIG. 19A. The transistor includes a device isolation layer 256 formed on a substrate 150. The device isolation layer 256 defines an active region. The active region includes a unit double layer including a silicon-germanium pattern 252p and a silicon pattern 254p. Portions of the active region at respective sides of the gate electrode include of a stacked structure of the silicon-germanium pattern 252p and the silicon pattern 254p. A portion of the active region overlapped with the gate electrode 264 has a structure in which the silicon pattern 254p is disposed on a region where the silicon-germanium pattern 252p is removed. The gate electrode 264 extends along sidewalls of the silicon pattern 254p to be aligned to an insulating pattern 263 filling the region underlying the silicon pattern 254p, that is, the silicon pattern 254p is surrounded by the gate electrode 264 and the insulating pattern 263. Source/drain regions 254s and 254d are formed in the silicon pattern 254p at respective sides of the gate electrode 264. Sidewall spacers 266 may be formed on sidewalls of the gate electrode 264. The source/drain regions 254s and 254d may have an LDD structure or a DDD structure. A channel width is determined according to a height of the silicon pattern 254p. A gate insulating layer 262 is interposed between the gate electrode 264 and the silicon pattern 254p. The silicon-germanium pattern 252p is doped before forming the source/drain regions 254s and 254d. The silicon-germanium pattern 252p is doped with a concentration different from the source/drain regions 254s and 254d. In accordance with these embodiments, an insulating pattern is formed between the source and drain regions of the planar transistor. The insulating pattern is formed under a channel of a transistor in which a punch-through could occur, thus reducing or preventing punch-through.

FIGS. 20A-25A are cross-sectional views of fabrication products illustrating exemplary operation for fabricating the transistor of FIGS. 19A-19C. FIGS. 20B-25B are cross-sectional views taken along line V-V' of FIGS. 20A-25A, and FIGS. 20C-25C are cross-sectional views taken along line VI-VI' of FIGS. 20A-25A.

Figure 20A:
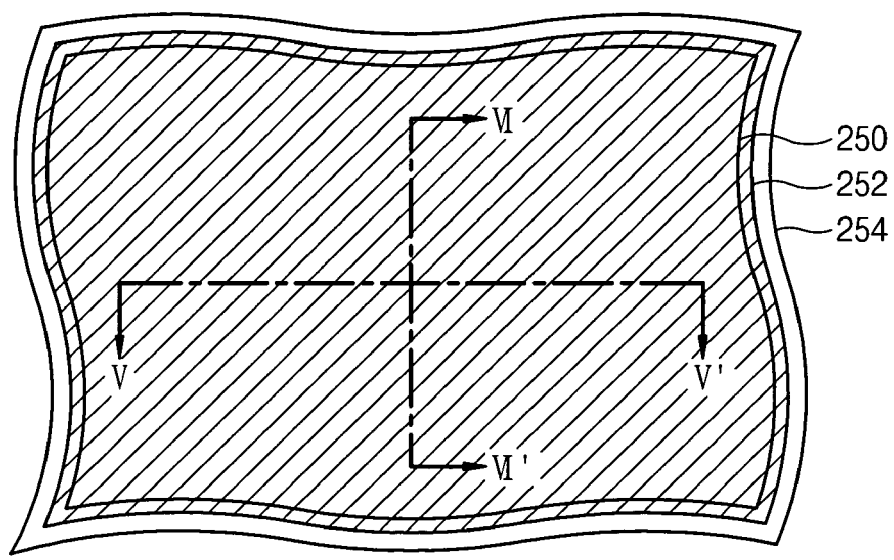
Figure 20B:
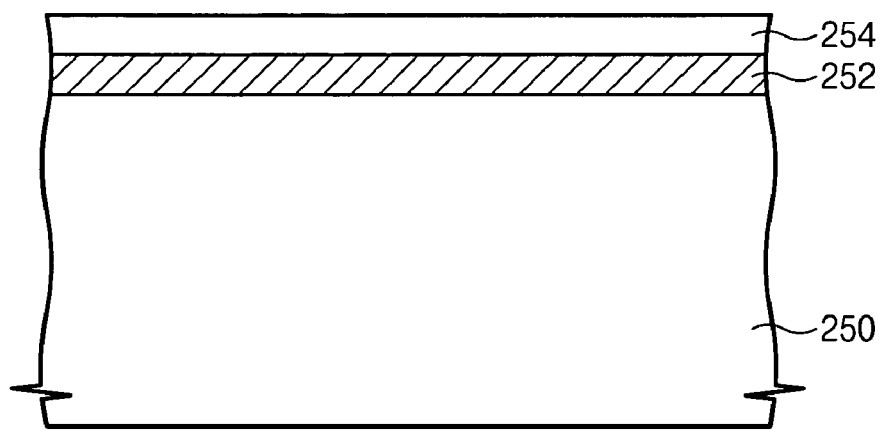
Figure 20C:
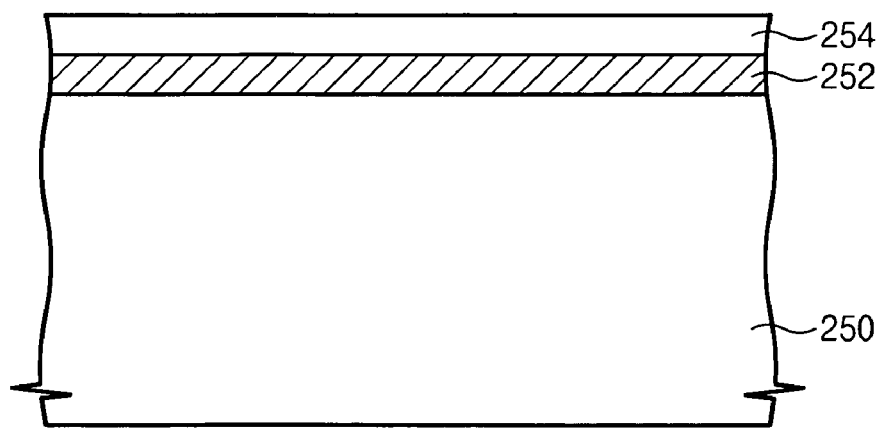

Referring to FIGS. 20A, 20B, and 20C, a silicon-germanium layer 252 and a silicon layer 254 are sequentially formed on a substrate 250. The silicon-germanium layer 252 and the silicon layer 254 may be formed using an epitaxial growth method. A channel width of the transistor to be formed depends on the thickness of the silicon layer 254. The substrate 250 may be, for example, a silicon-on-insulator (SOI) substrate, a germanium-on-insulator (GeOI) substrate, or a silicon-germanium-on-insulator (SiGeOI) substrate. If the uppermost layer of the substrate 250 is silicon-germanium, the silicon-germanium layer 252 may be omitted.

Figure 21A:
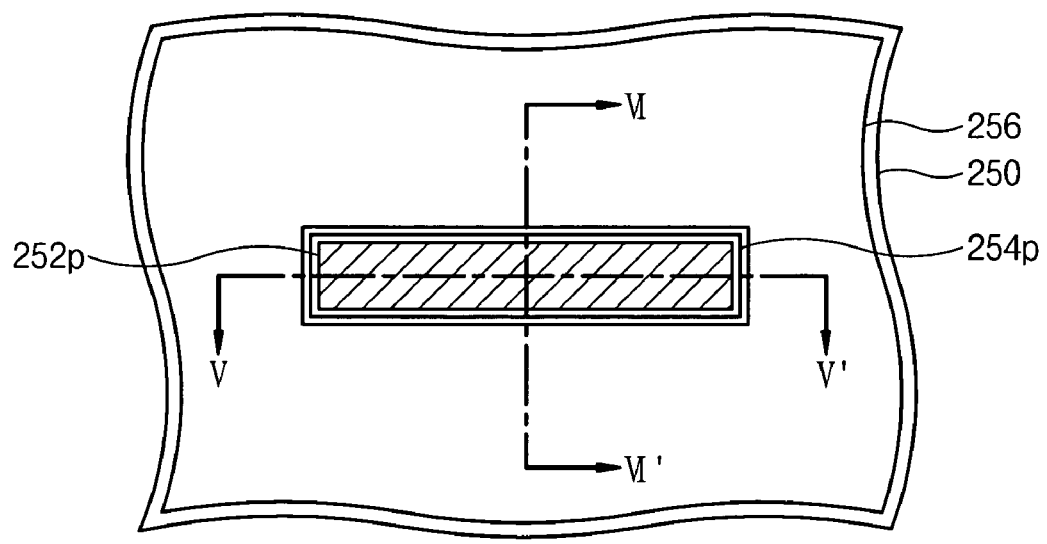
Figure 21B:
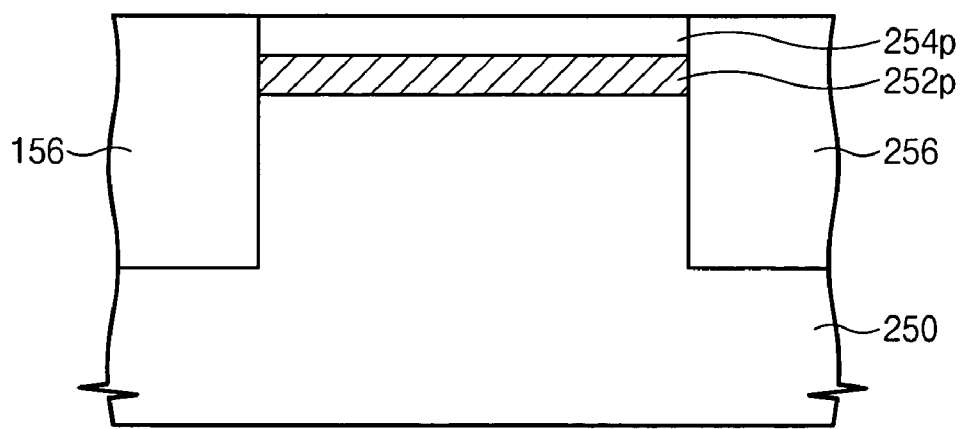
Figure 21C:
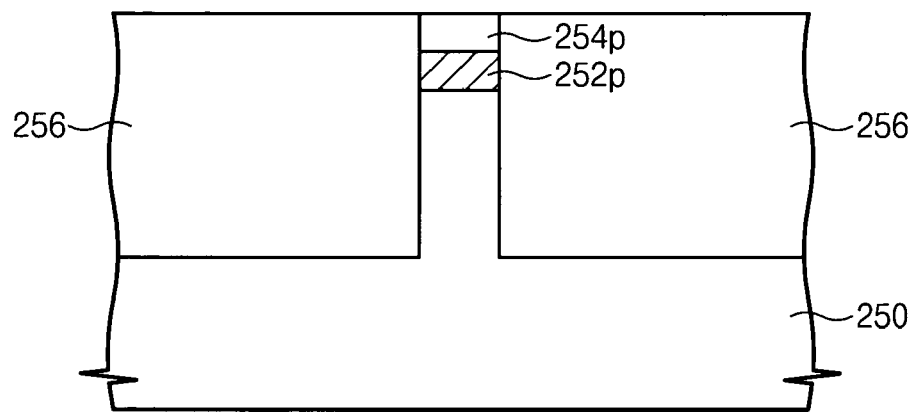

Referring to FIGS. 21A, 21B, and 21C, parts of the silicon layer 254, the silicon-germanium layer 252 and the substrate are etched to form a trench that defines an active region on which a silicon-germanium pattern 252p and the silicon pattern 254p are stacked. A device isolation 256 layer is formed in the trench. The active region may be formed by a conventional trench formation process.

Figure 22A:
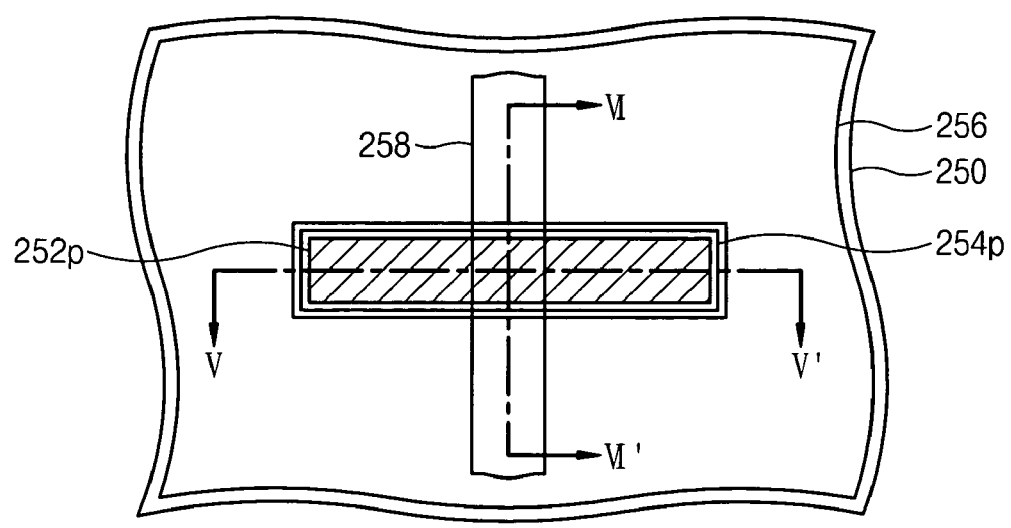
Figure 22B:
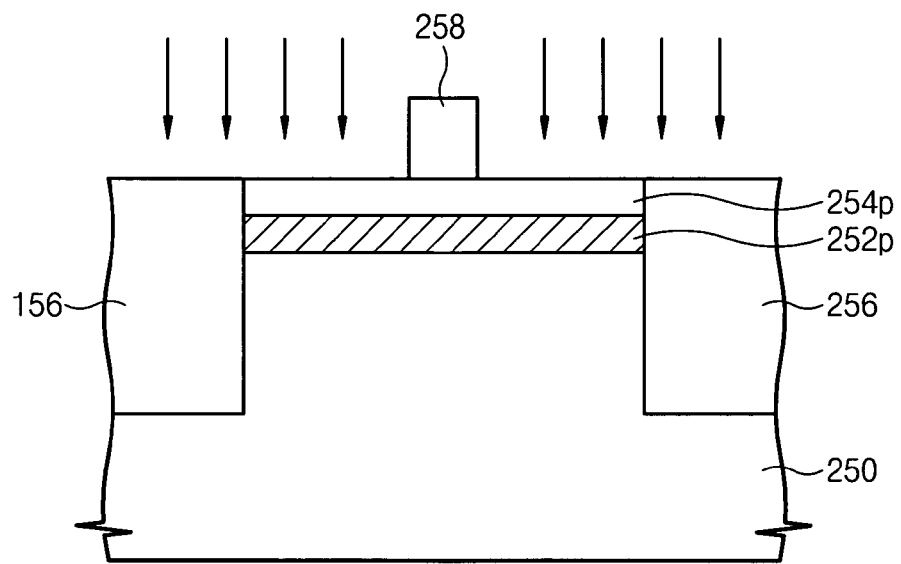
Figure 22C:
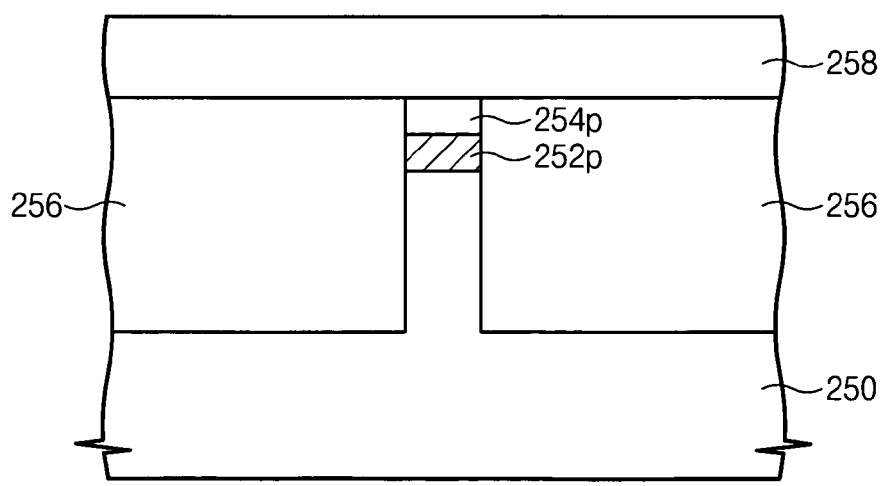

Referring to FIGS. 22A, 22B, and 22C, a dummy gate pattern 258 that crosses over the active region is formed. Ions are implanted into the active region using the dummy gate pattern 258 as an ion implantation mask. The silicon-germanium pattern 252p is doped to setting a projection range of ions to the silicon-germanium pattern 252p. Silicon-germanium under the dummy gate pattern 258 is not doped.

Figure 23A:
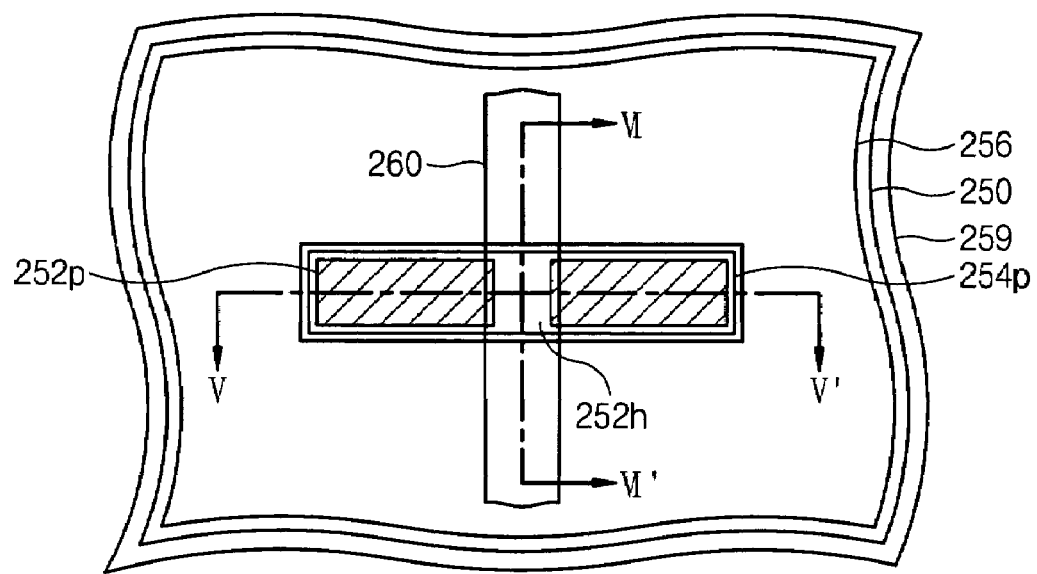
Figure 23B:
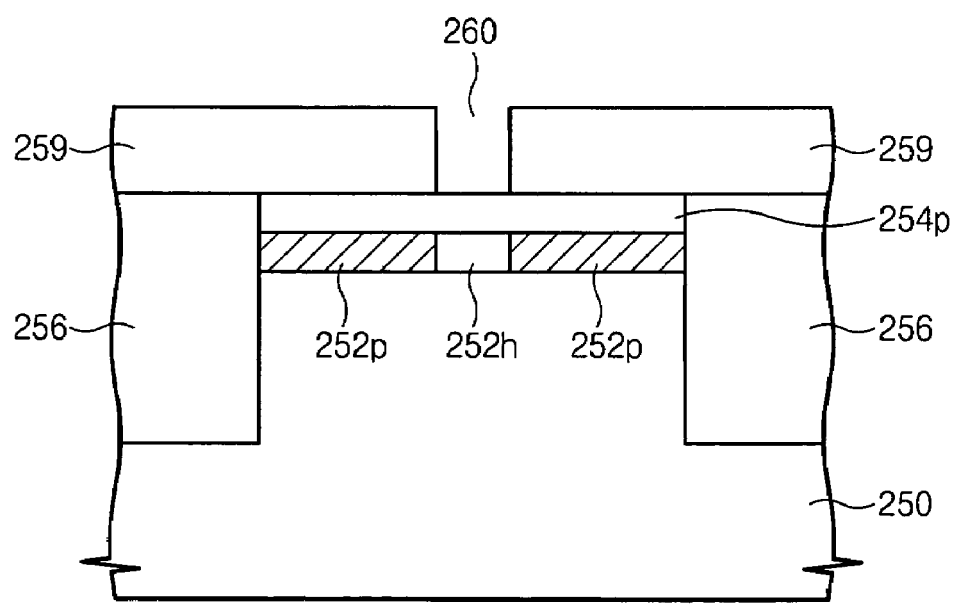
Figure 23C:
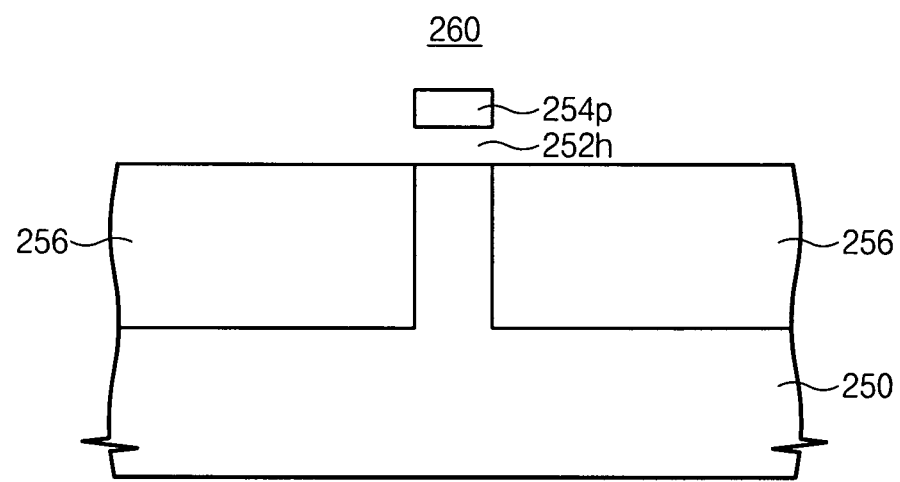

Referring to FIGS. 23A, 23B, and 23C, a sacrificial layer is formed on the substrate. The sacrificial layer is recessed to expose the dummy gate pattern 258, which is removed to form a sacrificial pattern 259 having an opening 260 crossing over the active region. The opening 260 is located where a gate electrode is to be formed. The device isolation layer 256 exposed at the opening 260 is etched to expose sidewalls of the active region, that is, sidewalls of the silicon pattern 254p and the silicon-germanium pattern 252p. The silicon-germanium pattern 252p exposed in the opening 260 is etched to form a hollow 252h.

Figure 24A:
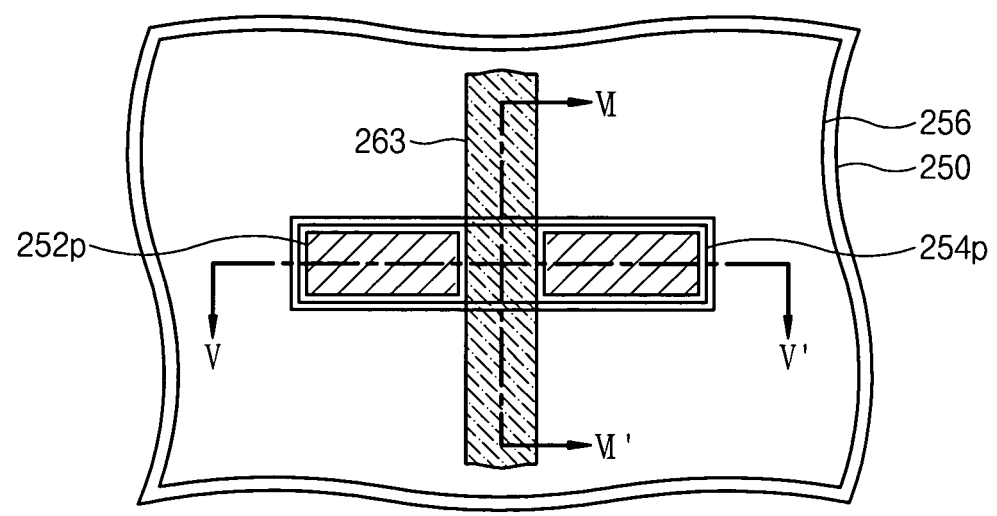
Figure 24B:
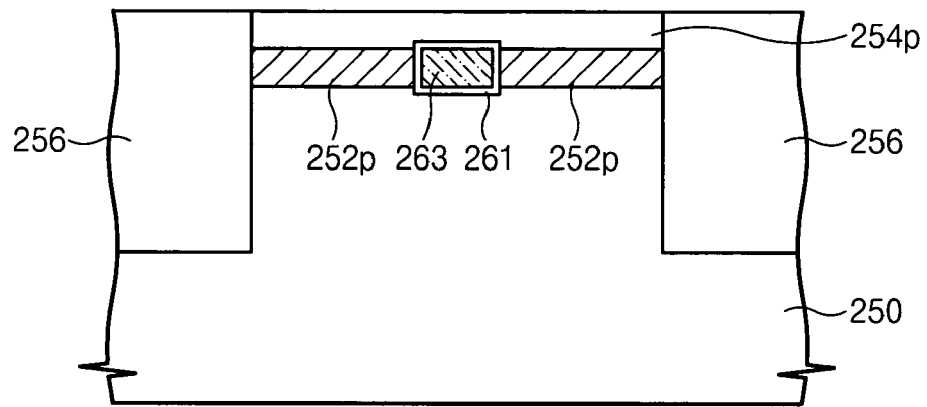
Figure 24C:
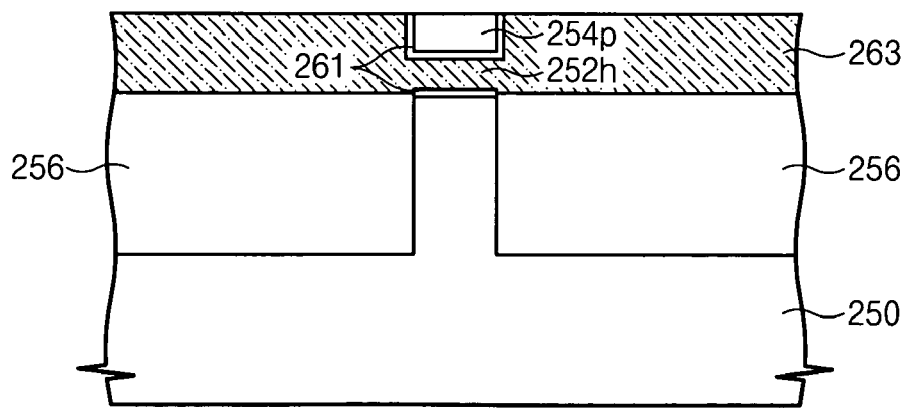
Figure 25A:
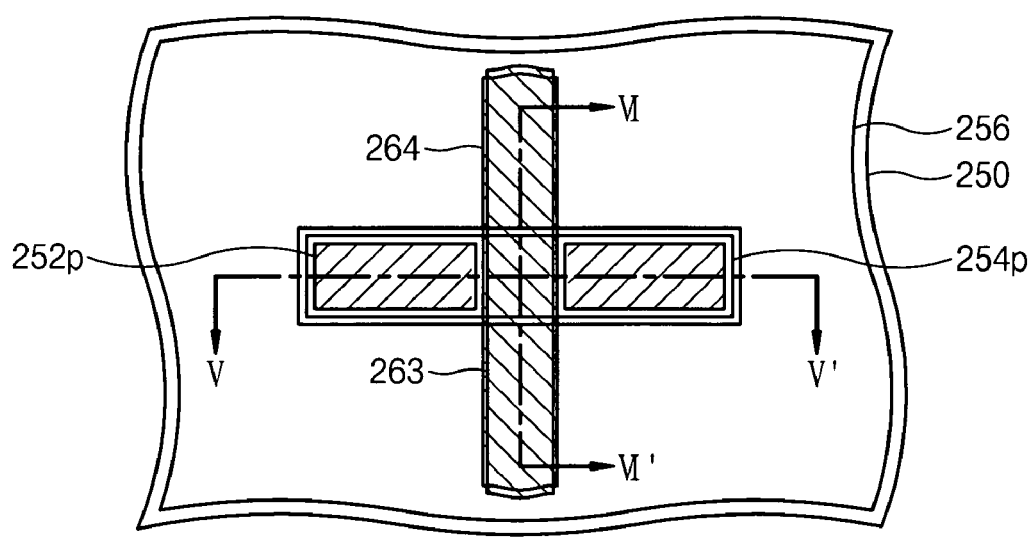
Figure 25B:
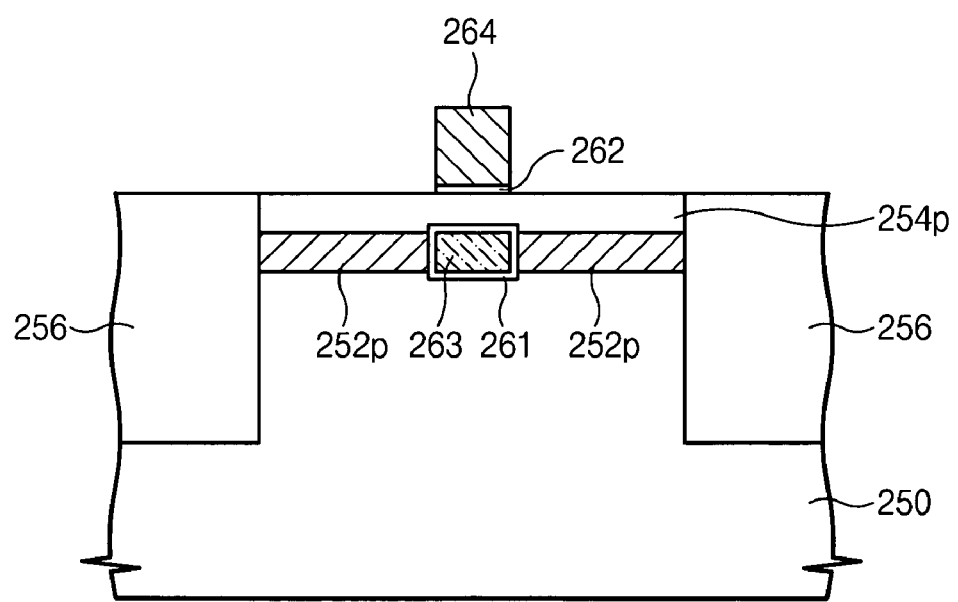
Figure 25C:
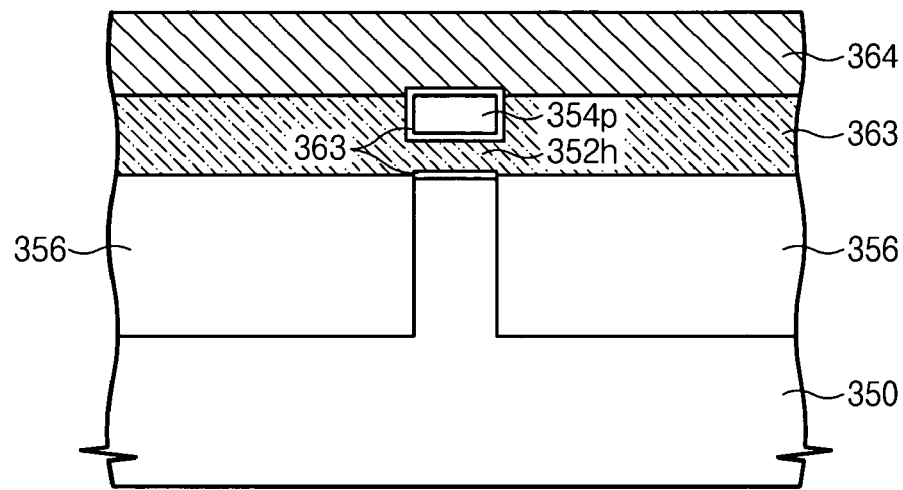

Referring to FIGS. 24A, 24B, and 24C, a buffer oxide layer 261 is conformally formed on the exposed silicon pattern 254p. An insulating material is formed in the opening 260 then it is recessed to expose a top surface of the active region. As a result, an insulating pattern 263 is formed. The insulating pattern 263 fills in the hollow 252h. The sacrificial pattern 259 is removed to expose the active region and the device isolation layer. Referring to FIGS. 25A, 25B, and 25C, a gate insulating layer 262 is formed on the active region. A gate electrode 264 that crosses over the active region is formed. The gate electrode 264 is disposed on the insulating pattern 263.

Impurities are implanted into the silicon pattern 254p at respective sides of the gate electrode 264 to form the source region 2254s and the drain region 254d shown in FIGS. 19A, 19B, and 19C. In addition, sidewall spacers 266 may be formed on sidewalls of the gate electrode 264. Before or after forming the sidewall spacers 266, ions may be implanted to form a drain with LDD structure or DDD structure.

Figure 26A:
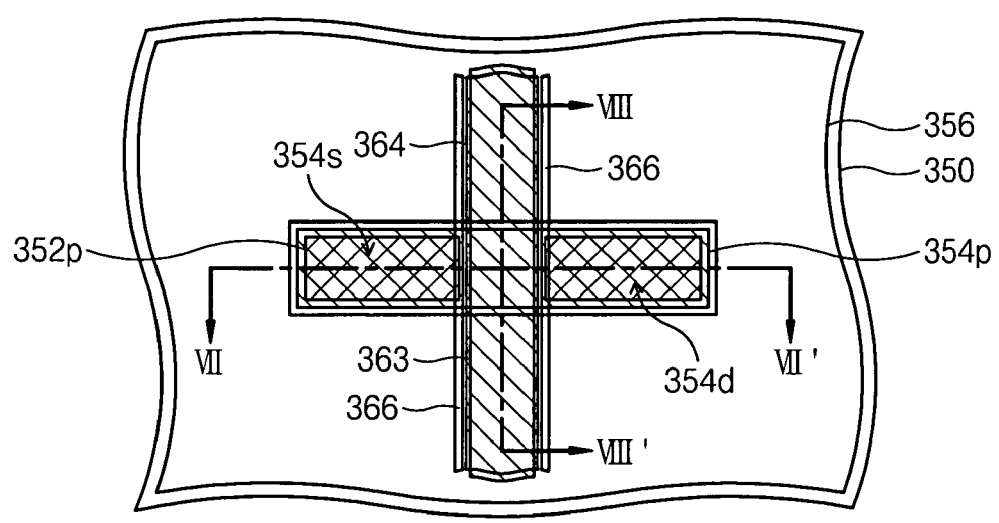
FIG. 26A is a plan view of a transistor according to fourth embodiments of the present invention.
Figure 26B:
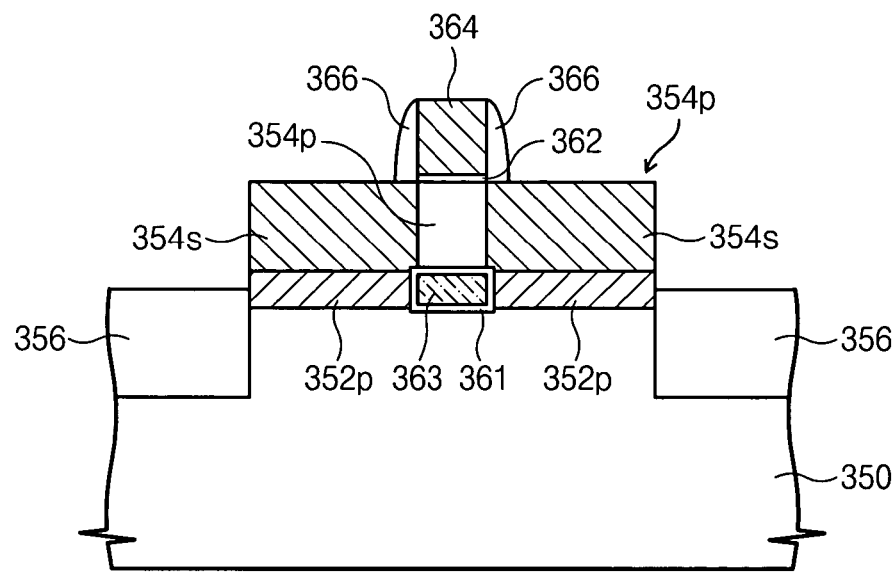
FIG. 26B is a cross-sectional view taken along line VII-VII' of FIG. 26A.
Figure 26C:
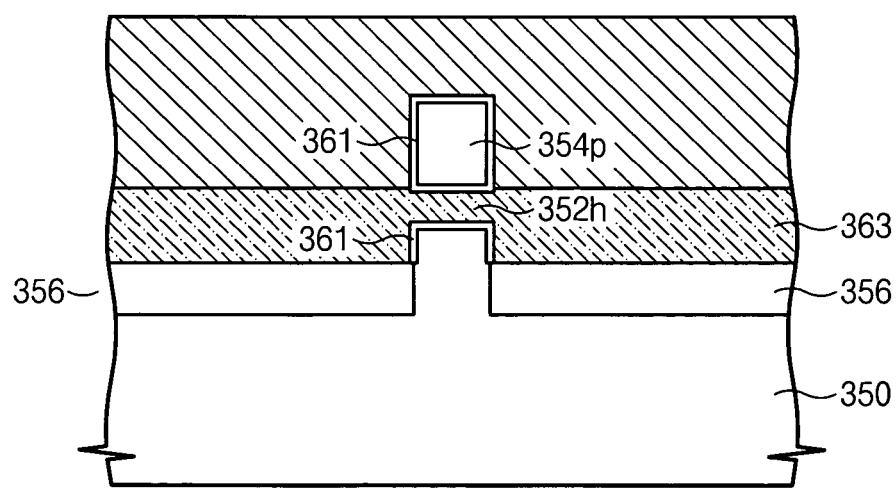
FIG. 26C is a cross-sectional view taken along line VIII-VIII' of FIG. 26A.

FIG. 26A is a plan view of a transistor according to fourth embodiments of the present invention. FIG. 26B is a cross-sectional view taken along line VII-VII' of FIG. 26A. FIG. 26C is a cross-sectional view taken along line VIII-VIII' of FIG. 26A.

Referring to FIGS. 26A, 26B, and 26C, a planar transistor includes an active region vertically extending from a substrate 360. The active region includes a unit double layer, which includes a stacked structure of a silicon-germanium pattern 352p and the silicon pattern 354p. A gate electrode 364 crosses over the active region. Portions of the active region on respective sides of the gate electrode 364 include a stacked structure of the silicon-germanium pattern 352p and the silicon pattern 354p. A portion of the active region overlapped with the gate electrode 364 has a structure in which the silicon pattern 354p is disposed on a region where the silicon-germanium pattern 352p is removed. The gate electrode 364 extends along sidewalls of the silicon pattern 354p to be aligned with an insulating pattern 363 filled in the region underlying the silicon pattern 354p. The gate electrode 364 covers a top surface and sidewalls of the silicon pattern 354p and the insulating pattern 363 fills in the region underlying the silicon pattern 354p, i.e., the silicon pattern 354p is surrounded by the gate electrode 364 and the insulating pattern 363. Source/drain regions 354s and 354d are formed on respective sides of the gate electrode 364. Sidewall spacers 366 may be formed on sidewalls of the gate electrode 364. The source/drain regions 354s and 354d may have an LDD structure or a DDD structure. A channel width is determined by the height of the silicon pattern 354p. A gate insulating layer 362 is interposed between the gate electrode 364 and the silicon pattern 354p. The silicon-germanium pattern 352p is doped before forming the source and drain regions 354s and 354d, with a concentration different from the source/drain regions 354s and 354d. In accordance with these embodiments, an insulating pattern is capable of preventing a punch-through between the source region and the drain region under a channel region that is controlled by a gate electrode.

FIGS. 27A-32A are plan views of fabrication products illustrating exemplary operations for fabricating the transistor of FIGS. 26A-26C. FIGS. 27B-32B are cross-sectional views taken along line VII-VII' of FIGS. 27A to 32A, and FIGS. 27C-32C are cross-sectional views taken along line VIII-VIII' of FIGS. 27A to 32A.

Figure 27A:
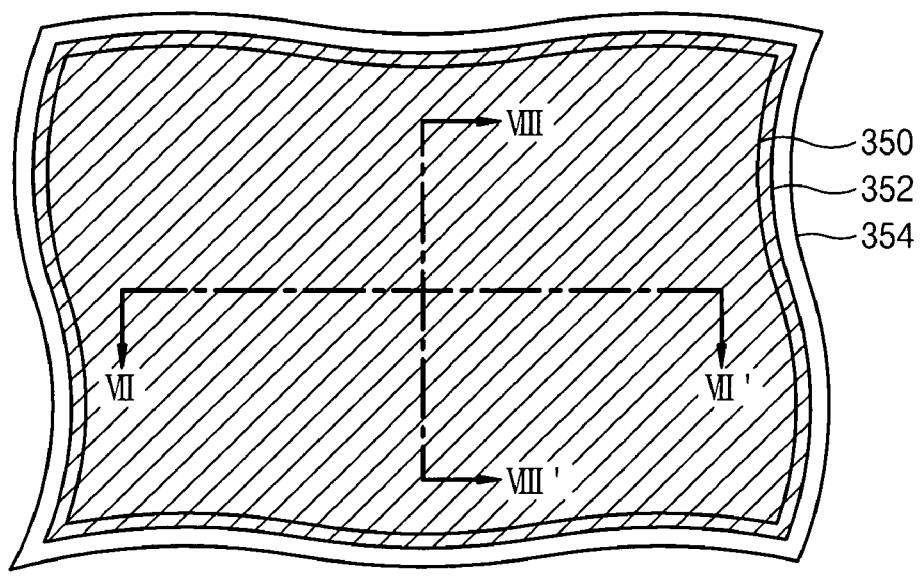
Figure 27B:
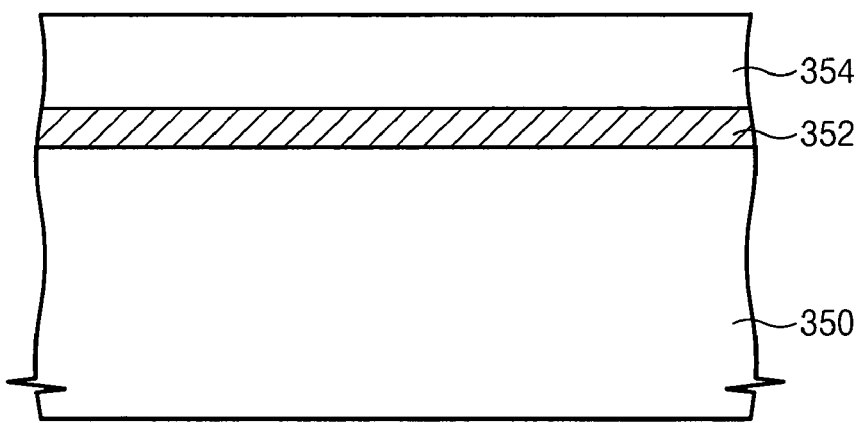
Figure 27C:
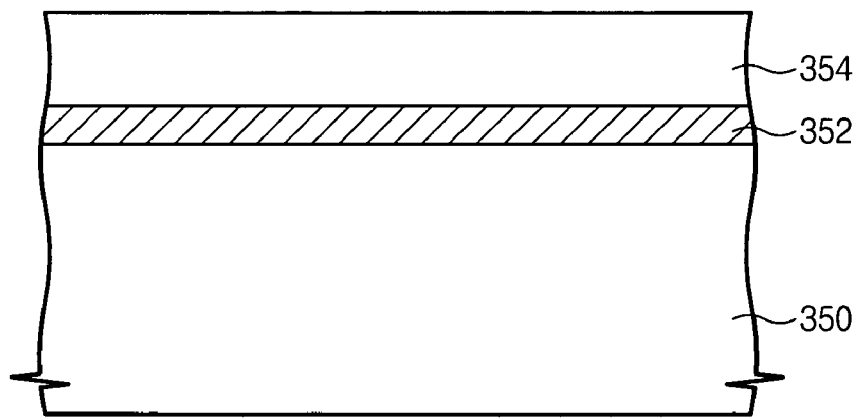

Referring to FIGS. 27A, 27B, and 27C, a silicon-germanium layer 352 and a silicon layer 354 are sequentially formed on a substrate 350. The silicon-germanium layer 352 and the silicon layer 354 may be formed using an epitaxial growth method. A channel width of the transistor to be formed depends on the thickness of the silicon layer 354. The substrate 350 may be, for example, a silicon-on-insulator (SOI) substrate, a germanium-on-insulator (GeOI) substrate, or a silicon-germanium-on-insulator (SiGeOI) substrate. If the uppermost layer of the substrate 350 is silicon-germanium, the silicon-germanium layer 352 may be omitted.

Figure 28A:
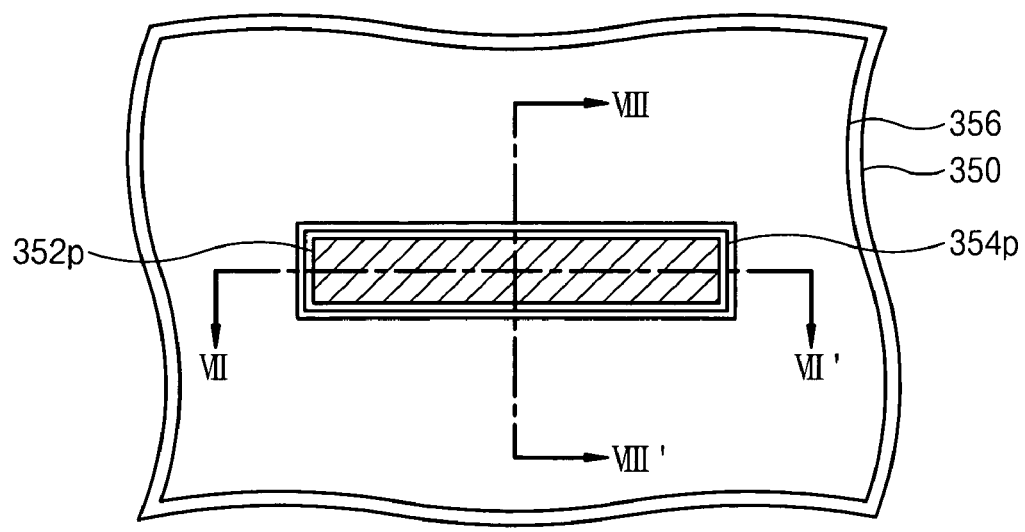
Figure 28B:
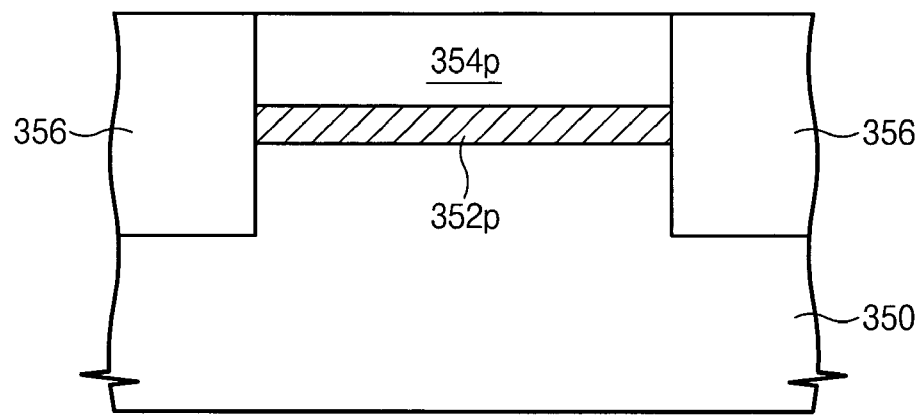
Figure 28C:
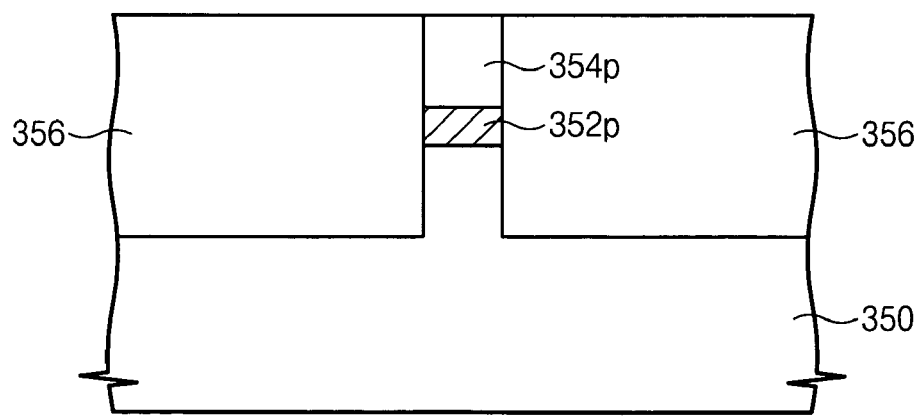

Referring to FIGS. 28A, 28B, and 28C, parts of the silicon layer 354, the silicon-germanium layer 352 and the substrate 350 are etched to form a trench that defines an active region with a fin-shaped stack of a silicon-germanium pattern 352p and a silicon pattern 354p. A device isolation layer 356 is formed in the trench. The active region may be formed using a conventional trench formation process.

Figure 29A:
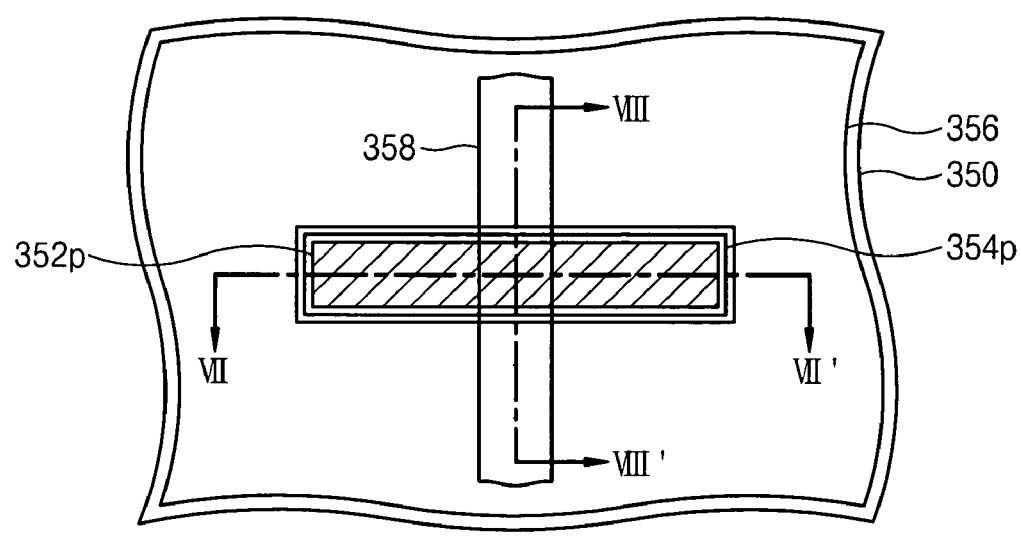
Figure 29B:
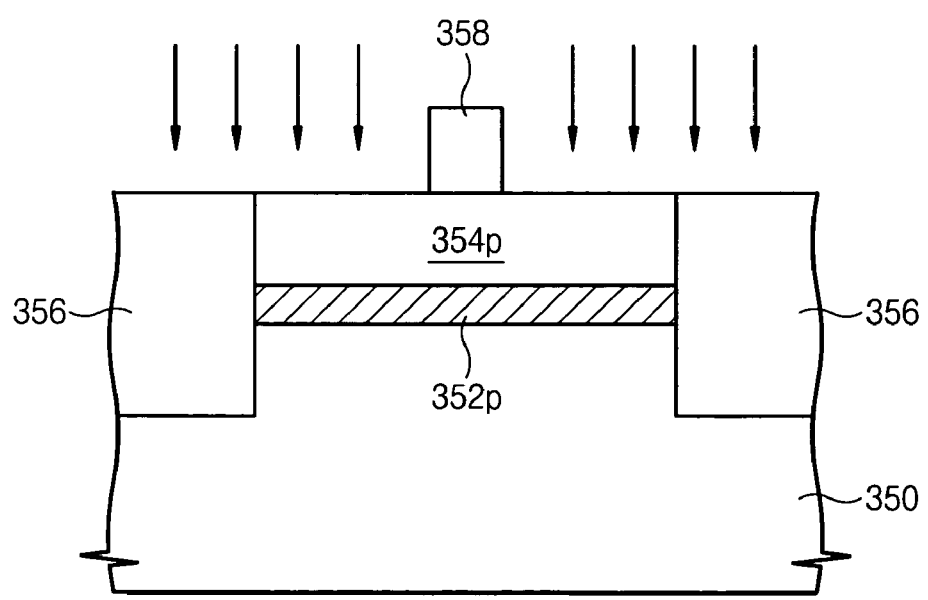
Figure 29C:
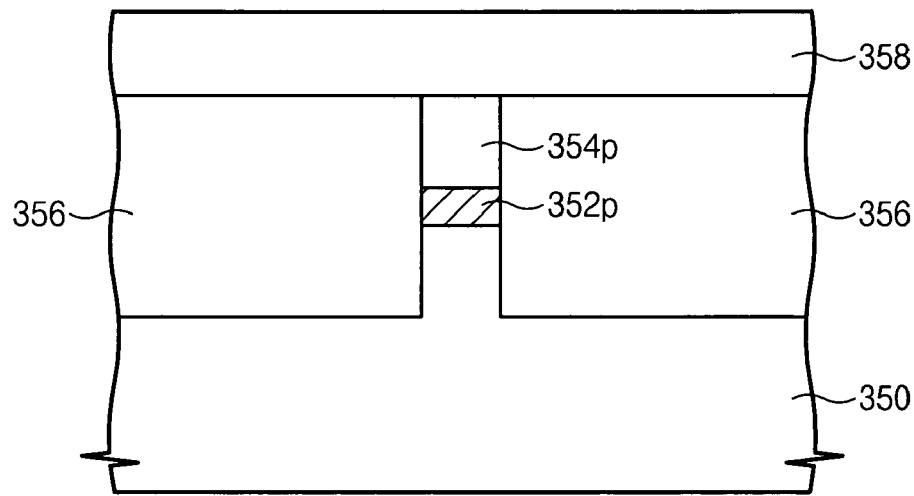

Referring to FIGS. 29A, 29B, and 29C, a dummy gate pattern 358 that crosses over the active region is formed. Ions are implanted into the active regions using the dummy gate pattern 358 as an ion implantation mask. The silicon-germanium pattern 352p is doped to set a projection range of ions to the silicon-germanium pattern 352p. Silicon-germanium under the dummy gate pattern 358 is not doped.

Figure 30A:
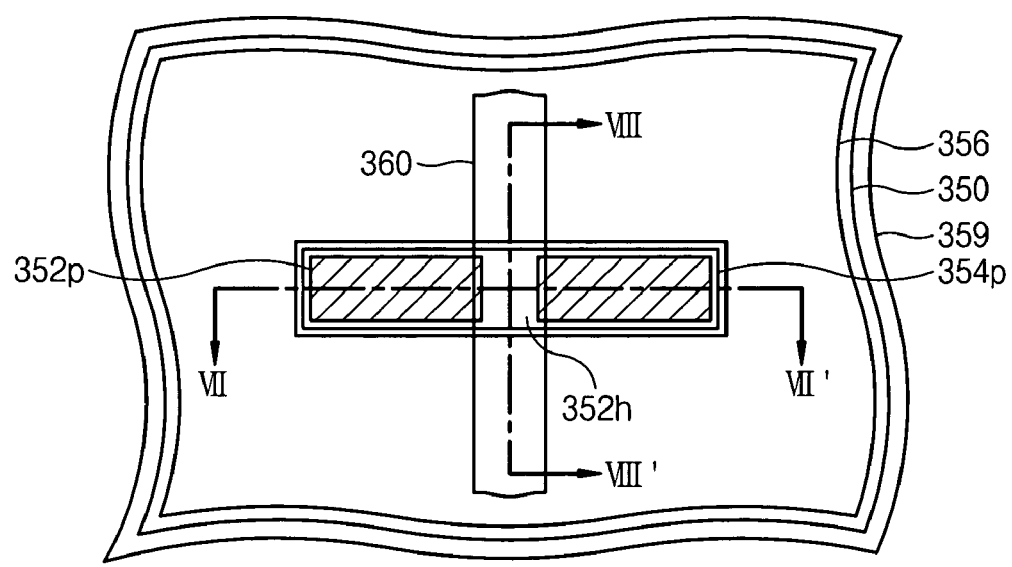
Figure 30B:
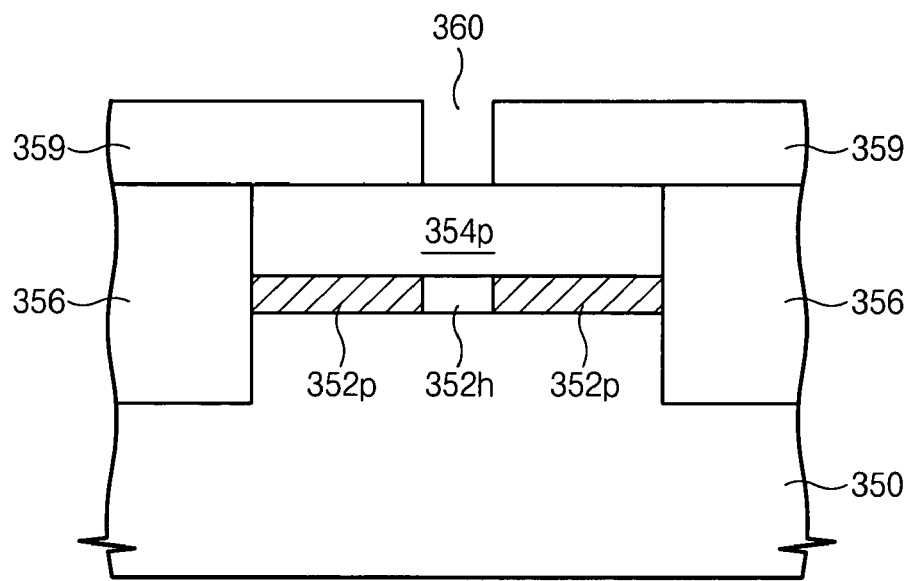
Figure 30C:
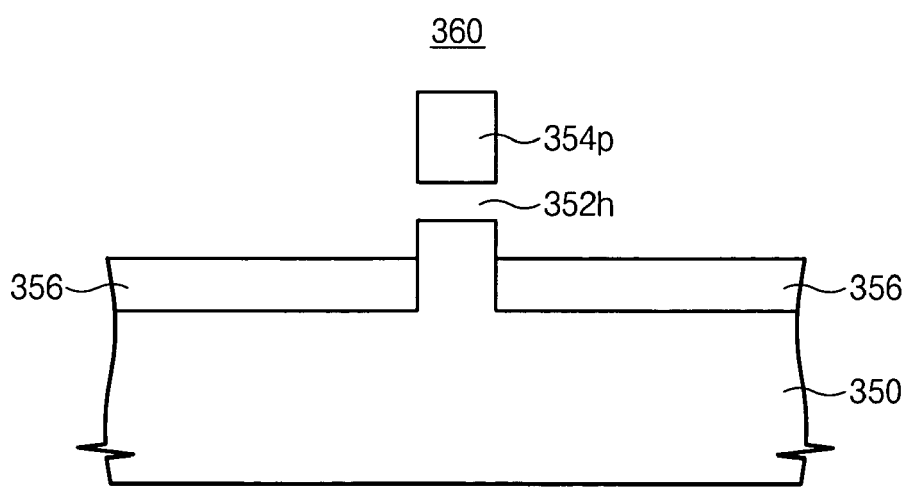

Referring to FIGS. 30A, 30B, and 30C, a sacrificial layer is formed on the substrate. The sacrificial layer is recessed to expose the dummy gate pattern 358, which is removed to form a sacrificial pattern 359 having an opening 360 crossing over the active region. The opening is located where a gate electrode is to be formed. A device isolation layer 356 exposed at the opening 360 is etched to expose sidewalls of the active region, including sidewalls of the silicon pattern 354p and the silicon-germanium pattern 352p. The silicon-germanium pattern 352p exposed in the opening 360 is etched to form a hollow 352h.

Figure 31A:
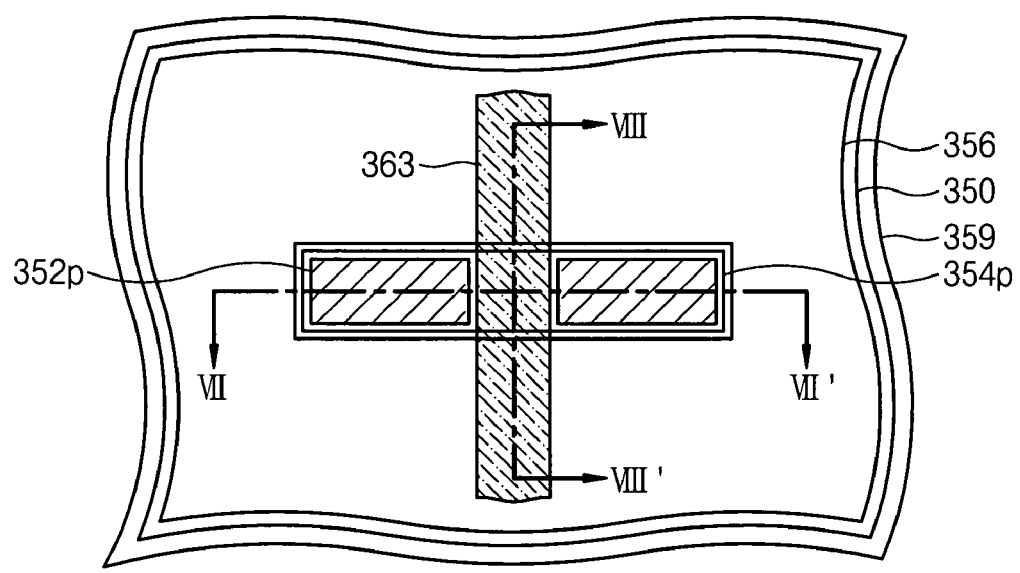
Figure 31B:
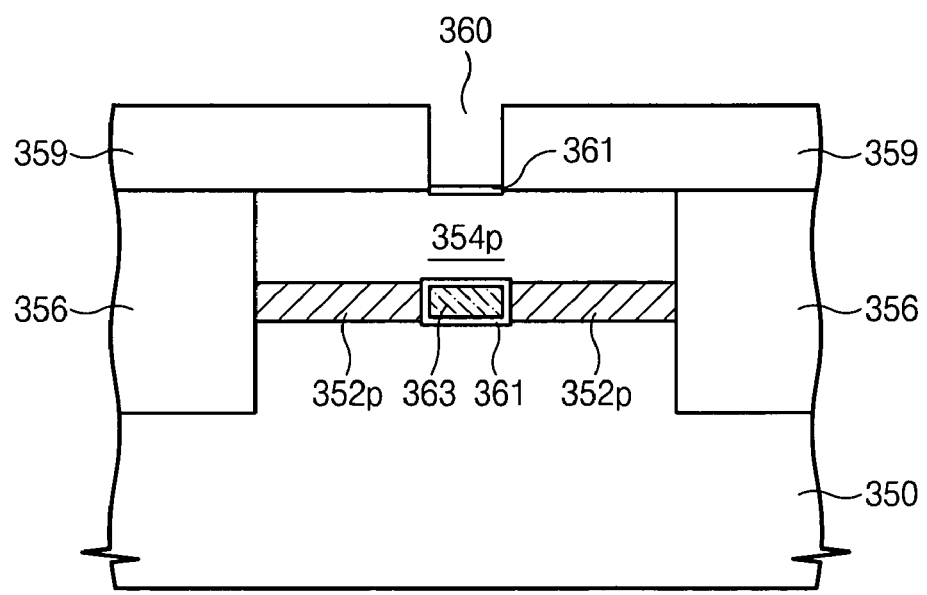
Figure 31C:
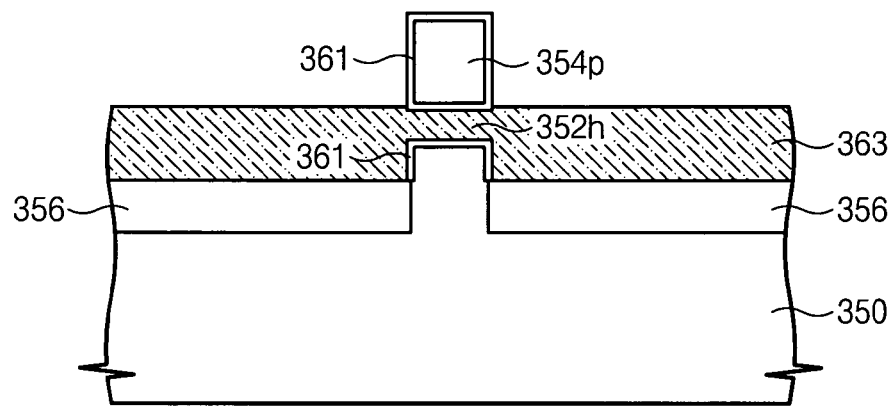

Referring to FIGS. 31A, 31B, and 31C, a buffer oxide layer is conformally formed on the exposed silicon pattern 354p. An insulating layer is formed on the substrate, filling the hollow 352h. The insulating layer is removed using CMP or etch-back until the sacrificial layer is exposed. The insulating layer is recessed to expose sidewalls of the silicon pattern 354p. As a result, an insulating pattern 363 is formed.

Figure 32A:
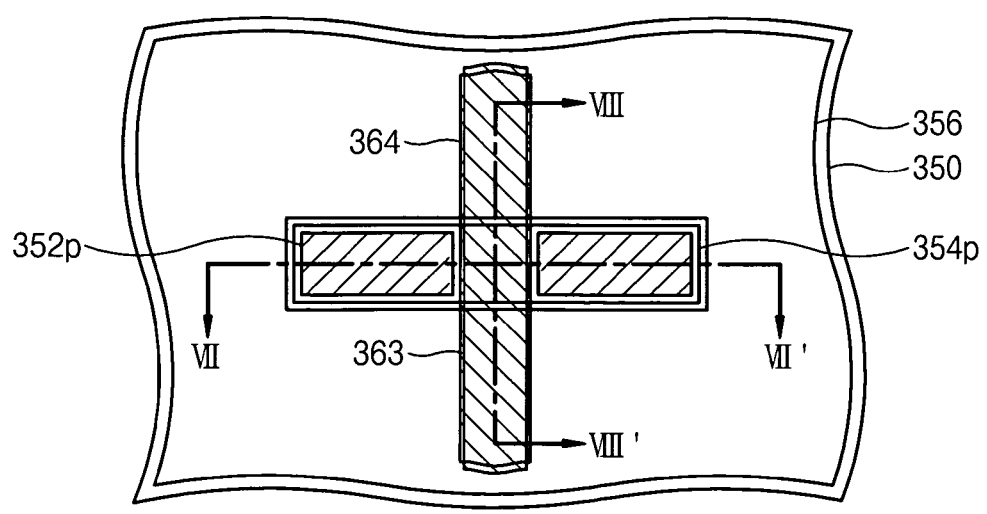
Figure 32B:
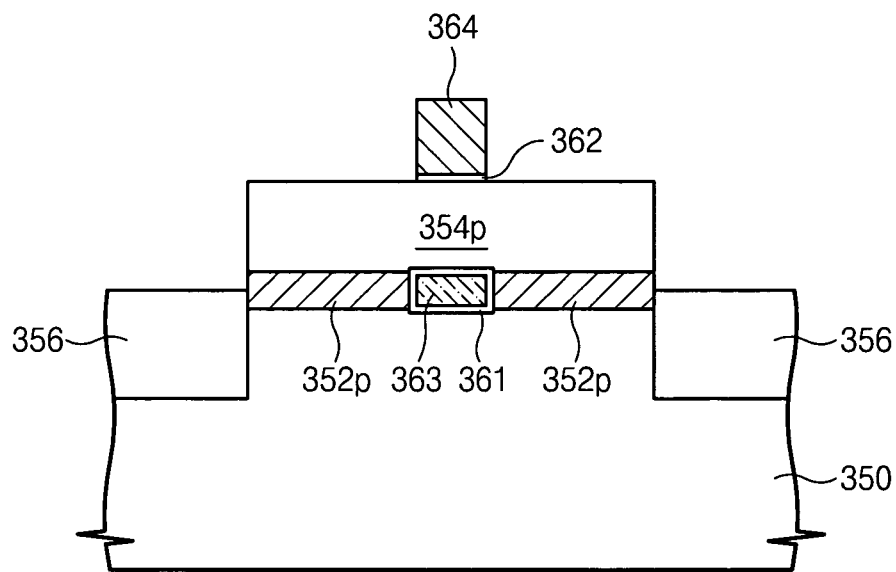
Figure 32C:
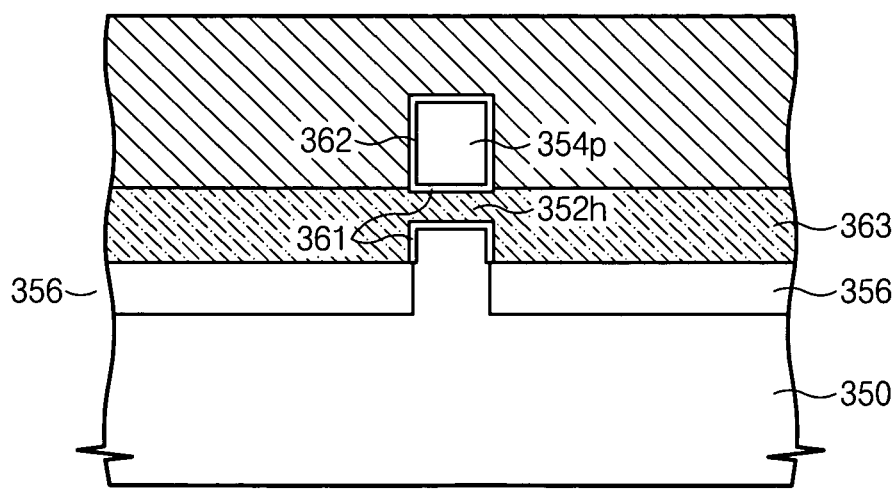

Referring to FIGS. 32A, 32B, and 32C, a buffer insulating layer on the exposed silicon pattern 354p is removed, and then a gate insulating layer 362 is formed. A conductive layer is formed and then recessed to form a gate electrode 364. The sacrificial pattern 359 is removed to expose sidewalls of the gate electrode 364, the active region, and the device isolation layer. At this time, the sidewalls of the silicon pattern 354p covered with the gate electrode 364 are exposed. Because the silicon-germanium pattern does not influence operation of the transistor, whether it is exposed or not is generally not important.

Impurities are implanted into the silicon pattern 354p at respective sides of the gate electrode 364 to form the source/drain regions 354s and 354d shown in FIGS. 26A, 26B, and 26C. Sidewall spacers 366 may be formed on sidewalls of the gate electrode 364. Before or after forming the sidewall spacer 366, ions may be implanted to form a drain with LDD structure or DDD structure.

In some embodiments of the present invention, silicon-germanium is doped using an oblique ion implantation method, which can reduce the width of an un-doped region can be reduced. Additionally, the width of the un-doped region can be increased by doping after forming a dummy spacer at sidewalls of a dummy gate pattern. This means that the width of a subsequently formed hollow adjacent the channel can be optimized. The dummy spacer may be removed after doping. Additional processes may be performed before forming the gate oxide layer. One is a sacrificial oxidation process for rounding an edge portion of the hollow. The other is a process for recessing a surface of a silicon pattern defining the hollow.

In some embodiments of the present invention, silicon-germanium is selectively etched using an etch ratio difference between doped silicon-germanium and an un-doped silicon-germanium so that it is possible to form a hollow for formation of a gate electrode or insulating region with a narrow width. Therefore, it is possible to reduce a variation in channel length in a gate all around type transistor.

Many alterations and modifications may be made by those having ordinary skill in the art, given the benefit of the present disclosure, without departing from the spirit and scope of the invention. Therefore, it must be understood that the illustrated embodiments have been set forth only for the purposes of example, and that it should not be taken as limiting the invention as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above and what is conceptually equivalent.

What is claimed is:

1. A method of fabricating a transistor, the method comprising:
    forming an elongate stacked semiconductor structure on a substrate, the stacked semiconductor structure comprising a second semiconductor material region disposed on a first semiconductor material region;
    selectively doping the first semiconductor material region to produce spaced-apart impurity-doped first semiconductor material regions and a lower dopant concentration first semiconductor material region therebetween;
    etching to expose a portion of the second semiconductor material region between the impurity-doped first semiconductor material regions, wherein the etching removes at least a portion of the lower dopant concentration first semiconductor material region to form a hollow between the substrate and the portion of the second semiconductor material region between the impurity-doped first semiconductor material regions;
    forming an insulation layer that surrounds the exposed portion of the second semiconductor material region between the impurity-doped first semiconductor material regions;
    forming a gate electrode that conforms to the insulation layer and fills the hollow; and
    forming source/drain regions in the second semiconductor material regions on respective sides of the gate electrode.

2. A method according to claim 1, wherein the first semiconductor material region comprises a silicon-germanium region, and wherein the second semiconductor material region comprises a silicon region.

3. A method according to claim 1, wherein the doping of the impurity-doped first semiconductor material regions provides an etching selectivity with respect to the lower dopant concentration first semiconductor material region in the etching to expose the portion of the second semiconductor material region between the impurity-doped first semiconductor material regions and form the hollow between the substrate and the portion of the second semiconductor material region between the impurity-doped first semiconductor material regions.

4. A method according to claim 1, wherein the selective doping causes directional etching in the etching to expose the portion of the second semiconductor material region between the impurity-doped first semiconductor material regions and form the hollow between the substrate and the portion of the second semiconductor material region between the impurity-doped first semiconductor material regions.

5. A method according to claim 1, wherein the selective doping comprises:
    forming a dummy gate electrode pattern that transversely crosses the stacked semiconductor structure; and
    implanting impurities into the first semiconductor material region using the dummy gate electrode pattern as an implantation mask.

6. A method according to claim 1:
    wherein the etching is preceded by forming an isolation region around the stacked semiconductor structure; and
    wherein the etching comprises:
    forming an etching mask on the stacked semiconductor structure and the isolation region, the etching mask having an opening therein that transversely crosses the stacked semiconductor and exposes the isolation region on respective sides of the stacked semiconductor structure; and
        etching through the opening in the etching mask to remove portions of the isolation region and expose sidewalls of the portion of the second semiconductor material region disposed between the impurity-doped first semiconductor material regions and to form the hollow between the substrate and the portion of the second semiconductor material region between the impurity-doped first semiconductor material regions.

7. A method according to claim 1:
    wherein the stacked semiconductor structure comprises a first second semiconductor material region disposed on a first semiconductor material region, a second first semiconductor material region on the first second semiconductor material region, and a second semiconductor material region on the second first semiconductor material region;
    wherein selectively doping the first semiconductor material region comprises selectively doping the first and second first semiconductor material regions to produce spaced-apart impurity-doped first semiconductor material regions and a lower dopant concentration first semiconductor material region therebetween in each of the first and second first semiconductor material regions;

wherein etching to expose a portion of the second semiconductor material region between the impurity-doped first semiconductor material regions comprises etching to expose portions of the first and second semiconductor material regions between the impurity-doped first semiconductor material regions, wherein the etching removes at least a portion of the lower dopant concentration first semiconductor material regions to form a first hollow between the substrate and the portion of the first second semiconductor material region between the impurity-doped first semiconductor material regions and a second hollow between the portion of the first second semiconductor material region between the impurity-doped first semiconductor material regions and the portion of the second semiconductor material region between the impurity-doped first semiconductor material regions;

wherein forming an insulation layer comprises forming an insulation layer that surrounds the exposed portions of the first and second semiconductor material regions between the impurity-doped first semiconductor material regions; and wherein forming a gate electrode comprises forming a gate electrode that conforms to the insulation layer and fills the first and second hollows.

8. A method according to claim 7, wherein the selective doping comprises:
forming a dummy gate electrode pattern that transversely crosses the stacked semiconductor structure; and
implanting impurities into the first and second first semiconductor material regions using the dummy gate electrode pattern as an implantation mask.

9. A method according to claim 7:
wherein the etching is preceded by forming an isolation region around the stacked semiconductor structure; and
wherein the etching comprises:
forming an etching mask on the stacked semiconductor structure and the isolation region, the etching mask having an opening therein that transversely crosses the stacked semiconductor and exposes the isolation region on respective sides of the stacked semiconductor structure; and
etching through the opening in the etching mask to remove portions of the isolation region and expose sidewalls of the portions of the first and second semiconductor material regions disposed between the impurity-doped first semiconductor material regions and to form the first and second hollows.

10. A method according to claim 1, further comprising forming sidewall spacers on respective sidewalls of the gate electrode.

11. A method of fabricating a transistor, the method comprising:
forming an elongate stacked semiconductor structure on a substrate, the stacked semiconductor structure comprising a second semiconductor material region disposed on a first semiconductor material region;
selectively doping the first semiconductor material region to produce spaced-apart impurity-doped first semiconductor material regions and a lower dopant concentration first semiconductor material region therebetween;
etching to expose a portion of the second semiconductor material region between the impurity-doped first semiconductor material regions, wherein the etching removes at least a portion of the lower dopant concentration first semiconductor material region to form a hollow between the substrate and the portion of the second semiconductor material region between the impurity-doped first semiconductor material regions;

forming an insulation layer that surrounds the exposed portion of the second semiconductor material region between the impurity-doped first semiconductor material regions;

forming an insulation region in the hollow between the substrate and the portion of the second semiconductor material region between the impurity-doped first semiconductor material regions;

forming a gate electrode that conforms to the insulation layer on top and sidewall surfaces of the portion of the second semiconductor material region between the impurity-doped first semiconductor material regions; and forming source/drain regions in the second semiconductor material regions on respective sides of the gate electrode.

12. A method according to claim 11, wherein the first semiconductor material region comprises a silicon-germanium region, and wherein the second semiconductor material region comprises a silicon region.

13. A method according to claim 11, wherein the doping of the impurity-doped first semiconductor material regions provides an etching selectivity with respect to the lower dopant concentration first semiconductor material region in the etching to expose the portion of the second semiconductor material region between the impurity-doped first semiconductor material regions and form the hollow between the substrate and the portion of the second semiconductor material region between the impurity-doped first semiconductor material regions.

14. A method according to claim 11, wherein the selective doping causes directional etching in the etching to expose the portion of the second semiconductor material region between the impurity-doped first semiconductor material regions and form the hollow between the substrate and the portion of the second semiconductor material region between the impurity-doped first semiconductor material regions.

15. A method according to claim 11, wherein the selective doping comprises:
forming a dummy gate electrode pattern that transversely crosses the stacked semiconductor structure; and
implanting impurities into the first semiconductor material region using the dummy gate electrode pattern as an implantation mask.

16. A method according to claim 11:
wherein the etching is preceded by forming an isolation region around the stacked semiconductor structure; and
wherein the etching comprises:
forming an etching mask on the stacked semiconductor structure and the isolation region, the etching mask having an opening therein that transversely crosses the stacked semiconductor and exposes the isolation region on respective sides of the stacked semiconductor structure; and
etching through the opening in the etching mask to remove portions of the isolation region and expose sidewalls of the portion of the second semiconductor material region disposed between the impurity-doped first semiconductor material regions and to form the hollow between the substrate and the portion of the second semiconductor material region between the impurity-doped first semiconductor material regions.

17. A method according to claim 16, wherein forming an insulation region in the hollow between the substrate and the portion of the second semiconductor material region between the impurity-doped first semiconductor material regions comprises forming an insulation layer on portions of the substrate exposed by the opening in the etching mask and in the hollow between the substrate and the portion of the second semiconductor material region between the impurity-doped first semiconductor material regions.

18. A method according to claim 11, further comprising forming sidewall spacers on respective sidewalls of the gate electrode.

* * * * *